(12) United States Patent
Ham et al.

(10) Patent No.: US 12,501,706 B2
(45) Date of Patent: Dec. 16, 2025

(54) DISPLAY DEVICE

(71) Applicant: LG Display Co., Ltd., Seoul (KR)

(72) Inventors: Sujin Ham, Seoul (KR); Aesun Kim, Seoul (KR); Yongmin Jeong, Seoul (KR)

(73) Assignee: LG Display Co., Ltd., Seoul (KR)

( * ) Notice: Subject to any disclaimer, the term of this patent is extended or adjusted under 35 U.S.C. 154(b) by 648 days.

(21) Appl. No.: 17/882,326

(22) Filed: Aug. 5, 2022

(65) Prior Publication Data

US 2023/0187451 A1 Jun. 15, 2023

(30) Foreign Application Priority Data

Dec. 14, 2021 (KR) ........................ 10-2021-0178782

(51) Int. Cl.
  *H10D 86/60* (2025.01)
  *H01L 25/16* (2023.01)
  *H10D 86/40* (2025.01)
  *H10H 20/857* (2025.01)

(52) U.S. Cl.
  CPC ........... *H10D 86/60* (2025.01); *H01L 25/167* (2013.01); *H10D 86/411* (2025.01); *H10H 20/857* (2025.01)

(58) Field of Classification Search
  None
  See application file for complete search history.

(56) References Cited

U.S. PATENT DOCUMENTS

| 9,841,548 | B2 | 12/2017 | Kim et al. |
| 11,322,565 | B2 | 5/2022 | Jeon et al. |
| 2021/0027671 | A1 | 1/2021 | Lee et al. |
| 2021/0126172 | A1 | 4/2021 | Eom et al. |
| 2021/0183962 | A1* | 6/2021 | Kim ................ G09G 3/3225 |
| 2022/0075419 | A1 | 3/2022 | Nomoto |

FOREIGN PATENT DOCUMENTS

| JP | 2018532250 A | 11/2018 |
| JP | 2020106832 A | 7/2020 |
| JP | 2020107660 A | 7/2020 |
| KR | 20170072999 A | 6/2017 |
| KR | 10-2021-0012391 A | 2/2021 |
| KR | 10-2022-0049895 A | 4/2022 |

* cited by examiner

*Primary Examiner* — Bo B Jang
(74) *Attorney, Agent, or Firm* — Seed Intellectual Property Law Group LLP

(57) ABSTRACT

A display device includes a stretchable lower substrate, a pattern layer disposed on the lower substrate. The pattern layer includes a plurality of first and second plate patterns, a plurality of first and second line patterns. The device includes a plurality of pixels formed on the plurality of first plate patterns, a plurality of first connection lines which connects the plurality of pixels, a gate driver formed on the plurality of second plate patterns, a power supply formed on the plurality of second plate patterns, a plurality of second connection lines, and a stretchable upper substrate.

33 Claims, 13 Drawing Sheets

DISPLAY DEVICE

CROSS-REFERENCE TO RELATED APPLICATIONS

This application claims the priority of Korean Patent Application No. 10-2021-0178782 filed on Dec. 14, 2021, in the Korean Intellectual Property Office, the disclosure of which is incorporated herein by reference.

BACKGROUND

Technical Field

The present disclosure relates to a display device, and more particularly to a stretchable display device.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Recently, a display device which is manufactured by forming a display unit and a wiring line on a flexible substrate such as plastic which is a flexible material so as to be stretchable in a specific direction and changed in various forms is getting attention as a next generation display device.

BRIEF SUMMARY

One or more embodiments of the present disclosure provide a display device in which the wiring line is not damaged even by the repeated stretching.

One or more embodiments of the present disclosure provide a display device in which all areas are biaxially stretchable.

Further embodiments of the present disclosure provide a display device which suppresses the tearing of the wiring line during a lift-off process.

Further embodiments of the present disclosure provide a display device which suppresses driving voltage drop.

The technical benefits of the present disclosure are not limited to the above-mentioned benefits, and other benefits, which are not mentioned above, can be clearly understood by those skilled in the art from the following descriptions.

In order to achieve the above-described benefits, according to an aspect of the present disclosure, a display device includes a lower substrate which includes an active area and a non-active area and is stretchable; a pattern layer which is disposed on the lower substrate and includes a plurality of first plate patterns and a plurality of first line patterns formed in the active area and a plurality of second plate patterns and a plurality of second line patterns formed in the non-active area; a plurality of pixels formed on the plurality of first plate patterns; a plurality of first connection lines which connects the plurality of pixels; a gate driver formed on the plurality of second plate patterns; a power supply formed on the plurality of second plate patterns; a plurality of second connection lines disposed in the non-active area; and an upper substrate which covers the gate driver, the power supply, and the plurality of pixels and is stretchable, the non-active area includes a first area located at the outside of the active area, a second area which is located at the outside of the first area and includes the plurality of gate drivers disposed therein, and a third area which is located at the outside of the second area and includes the plurality of power supplies disposed therein, and the plurality of second connection lines disposed in the first area is in contact with a metal pattern disposed on a layer different from the plurality of second connection lines, by means of an anchor hole.

According to another aspect of the present disclosure, a display device includes: a flexible substrate; a plurality of rigid patterns formed on the flexible substrate; a plurality of pixels which is formed above a plurality of first plate patterns spaced apart from each other, among the plurality of rigid patterns; and a power supply which is formed above some of a plurality of second plate patterns spaced apart from each other, among the plurality of rigid patterns, the power supply supplies a driving voltage of the plurality of pixels and is configured by power blocks which are spaced apart from each other in a first direction and a second direction.

Other matters of the embodiments are included in the detailed description and the drawings.

According to the present disclosure, an anchor hole is formed in a buffer line to stably ensure the stretching reliability of the display device.

According to the present disclosure, the buffer line is fixed by the anchor hole so that the display device is not damaged during the lift-off.

According to the present disclosure, the non-active area is biaxially stretched to improve the applicability of the display device.

According to the present disclosure, the power supply includes an additional power block which is electrically connected between power blocks to reduce or minimize the driving voltage drop.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
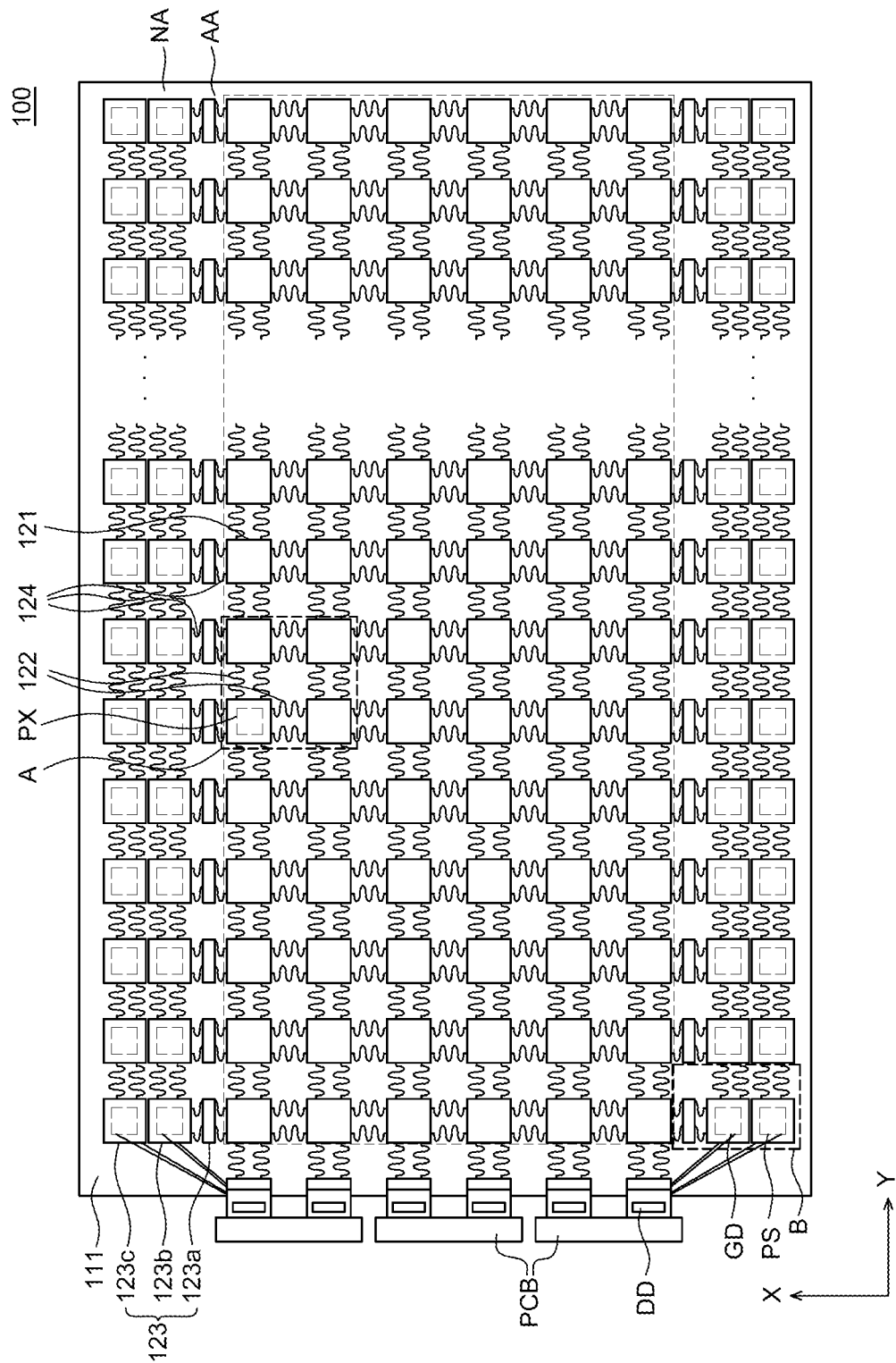
FIG. 1 is a plan view of a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

A display device according to an embodiment of the present disclosure is a display device which is capable of displaying images even in a bent or extended state and is also referred to as a stretchable display device, a flexible display device and an extendable display device. As compared with the general display devices of the related art, the display device has not only a high flexibility, but also stretchability. Therefore, the user may bend or extend a display device and a shape of a display device may be freely changed in accordance with manipulation of a user. For example, when the user holds ends of the display device to pull the display device, the display device may be extended to the pulling direction of the user. Alternatively, when the user disposes the display device on an outer surface which is not flat, the display device may be disposed to be bent in accordance with the shape of the outer surface. Further, when a force applied by the user is removed, the display device may return to its original shape.

Stretchable Substrate and Pattern Layer

FIG. 1 is a plan view of a display device according to an embodiment of the present disclosure.

Figure 2:
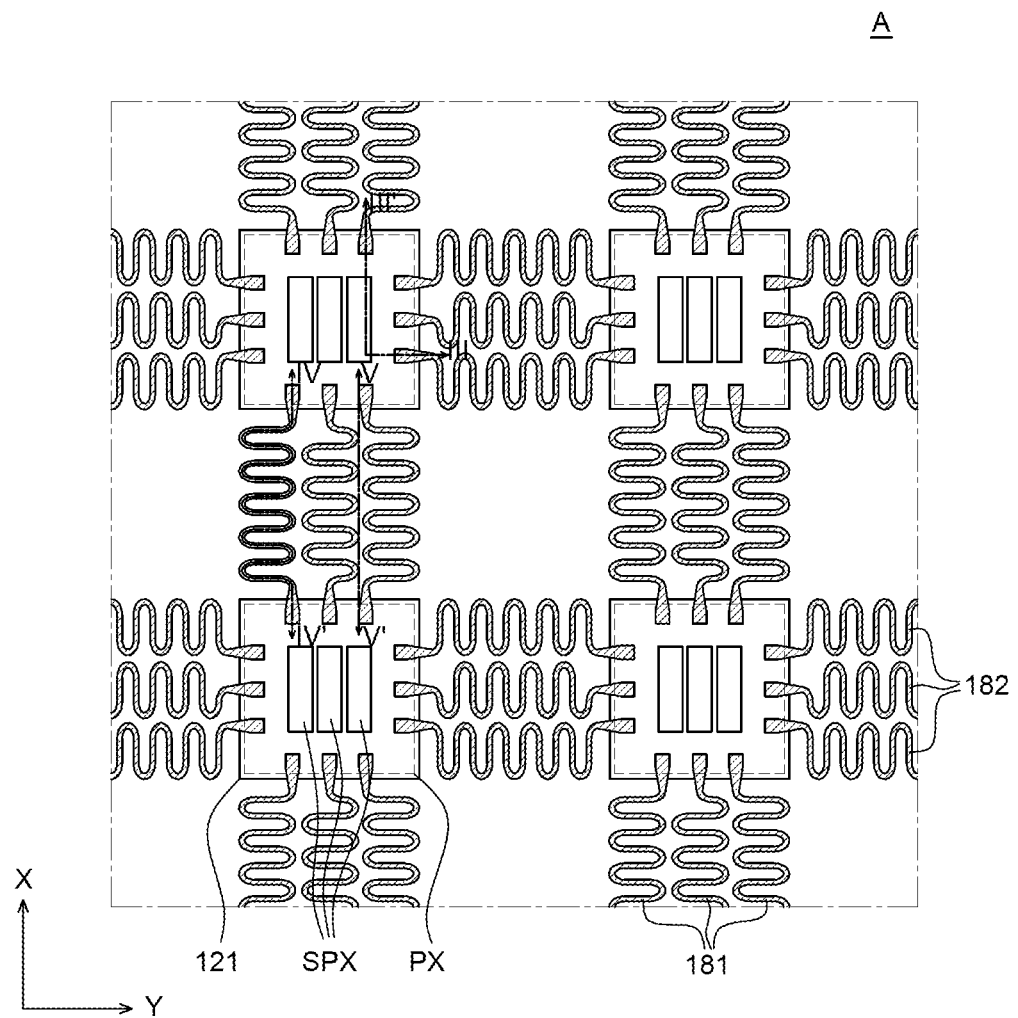
FIG. 2 is an enlarged plan view of an active area of a display device according to an embodiment of the present disclosure.

FIG. 2 is an enlarged plan view of an active area of a display device according to an embodiment of the present disclosure. Specifically, FIG. 2 is an enlarged plan view of an area A illustrated in FIG. 1.

Figure 3:
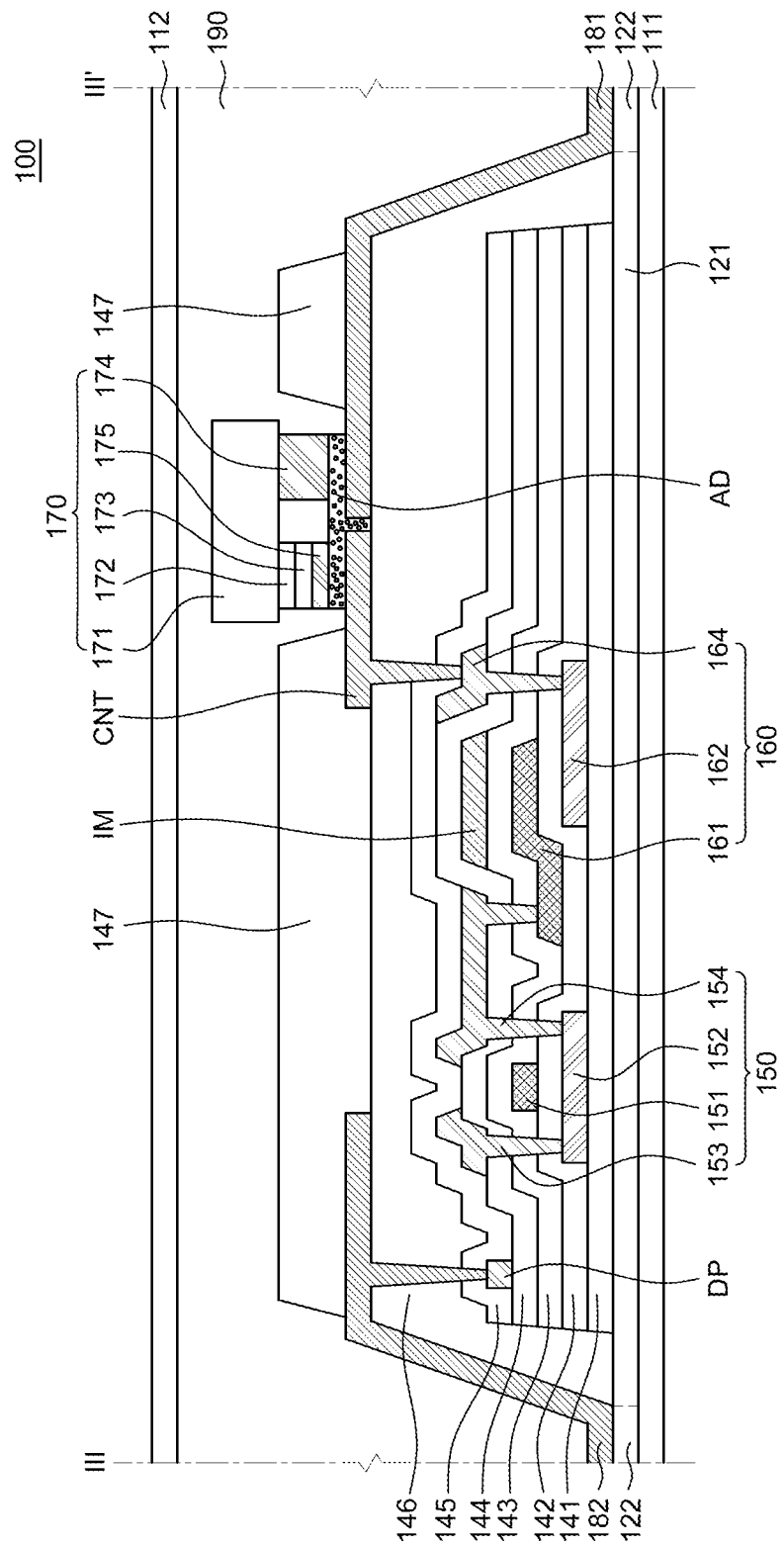
FIG. 3 is a cross-sectional view taken along the line III-III' of FIG. 2.

FIG. 3 is a cross-sectional view taken along the line III-III' of FIG. 2.

Referring to FIG. 1, a display device 100 according to an embodiment of the present disclosure may include a lower substrate 111, a pattern layer 120, a plurality of pixels PX, a gate driver GD, a data driver DD, and a power supply PS. The gate driver GD and the data driver DD may be referred to as driving circuits. The power supply PS may be referred to as power supply circuits PS. Referring to FIG. 3, the display device 100 according to the embodiment of the present disclosure may further include a filling layer 190 and an upper substrate 112.

The lower substrate 111 is a substrate which supports and protects several components of the display device 100. The upper substrate 112 is a substrate which covers and protects several components of the display device 100. That is, the lower substrate 111 is a substrate which supports the pattern layer 120 on which the pixels PX, the gate driver GD, and the power supply PS are formed. The upper substrate 112 is a substrate which covers the pixels PX, the gate driver GD, and the power supply PS.

The lower substrate 111 and the upper substrate 112 which are flexible substrates may be configured by an insulating material which is bendable or extendable. For example, the lower substrate 111 and the upper substrate 112 may be formed of a silicon rubber such as polydimethylsiloxane (PDMS) or an elastomer such as polyurethane (PU) or polytetrafluoroethylene (PTFE) and thus have a flexibility. Further, the materials of the lower substrate 111 and the upper substrate 112 may be the same, but are not limited thereto and may vary.

The lower substrate 111 and the upper substrate 112 are flexible substrates so as to be reversibly expandable and contractible. Accordingly, the lower substrate 111 may be referred to as a lower stretchable substrate, a lower stretching substrate, a lower extending substrate, a lower ductile substrate, a lower flexible substrate, a first stretchable substrate, a first stretching substrate, a first extending substrate, a first ductile substrate, or a first flexible substrate. The upper substrate 112 may be referred to as an upper stretchable substrate, an upper stretching substrate, an upper extending substrate, an upper ductile substrate, an upper flexible substrate, a second stretchable substrate, a second stretching substrate, a second extending substrate, a second ductile substrate, or a second flexible substrate. Further, moduli of elasticity of the lower substrate 111 and the upper substrate 112 may be several MPa to several hundreds of MPa. Further, a ductile breaking rate of the lower substrate 111 and the upper substrate 112 may be 100% or higher. In some embodiments, the ductile breaking rate refers to a stretching rate at a timing when an object to be stretched is broken or cracked. In other embodiments, the ductile breaking rate refers to an extension distance when an object to be stretched is broken or cracked. That is, the ductile breaking rate is defined as a percentage ratio of a length of an original object and a length of the stretched object when an object has been stretched sufficiently that it is considered broken. For example, if a length of an object (e.g., lower substrate 111) is 100 cm when the object is not stretched and then, it reaches a length of 110 cm when the object has been stretched enough that it becomes broken or cracked at this length, then it has been stretched to 110% of its original length. In this case, the ductile breaking rate of the object is 110%. The number could thus also be called a ductile breaking ratio since it is a ratio of the stretched length as the numerator compared to the original upstretched length as the denominator at the time the break occurs.

The object is considered broken when it can no longer function properly in the structure or circuit. For example, a wire that is a conductor would be considered broken when there is a sufficient degradation in its ability to carry current that it does not operate within the specifications of the circuit. Thus, in some embodiments, it might not require a full disconnection of the wire for it to be considered broken, a minor stress at a connection ends, a minor crack, a slight shift of the wire's location or other movement that causes it to no longer operate within its expected function would be considered a broken wire. If an insulator is stretched sufficiently that it no longer provides the amount of insulation needed for the structure or circuit, it would be considered broken. Breaking will also include in some embodiments a non-elastic stretching in which the object has been sufficiently stretched that it does not return to its original length and/or shape when it is no longer stretched.

A thickness of the lower substrate may be 10 μm to 1 mm, but is not limited thereto.

The lower substrate 111 may have an active area AA and a non-active area NA which encloses the active area AA.

The active area AA is an area in which images are displayed in the display device 100. The plurality of pixels PX is disposed in the active area AA. Each pixel PX may include a display element and various driving elements for driving the display element. Various driving elements may refer to at least one thin film transistor (TFT) and a capacitor, but are not limited thereto. The plurality of pixels PX may be connected to various wiring lines, respectively. For example, each of the plurality of pixels PX may be connected to various wiring lines, such as a gate line, a data line, a high potential power line, a low potential power line, and a reference voltage line.

The non-active area NA is an area where no image is displayed. The non-active area NA is adjacent to the active area AA to enclose the active area AA. However, it is not limited thereto so that the non-active area NA corresponds to an area excluding the active area AA from the lower substrate 111 and may be modified and separated in various forms. Components for driving the plurality of pixels PX disposed in the active area AA are disposed in the non-active area NA. That is, the gate driver GD and the power supply PS may be disposed in the non-active area NA. In the non-active area NA, a plurality of pads connected to the gate driver GD and the data driver DD may be disposed and each pad may be connected to each of the plurality of pixels PX of the active area AA.

On the lower substrate 111, the pattern layer 120 formed of a plastic material having a flexibility lower than that of the lower substrate 111 may be disposed. For example, the pattern layer 120 may be formed of polyimide (PI), polyacrylate, and polyacetate.

The pattern layer 120 may include a plurality of first plate patterns 121 (also referred to as a plurality of first plate structures 121) and a plurality of first line patterns 122 disposed in the active area AA and a plurality of second plate patterns 123 (also referred to as a plurality of second plate structures 123) and a plurality of second line patterns 124 disposed in the non-active area NA.

The plurality of first plate patterns 121 is disposed in the active area AA of the lower substrate 111 so that the plurality of pixels PX is formed on the plurality of first plate patterns 121. The plurality of second plate patterns 123 is disposed in the non-active area NA of the lower substrate 111 so that the gate driver GD and the power supply PS are formed on the plurality of second plate patterns 123.

The plurality of first plate patterns 121 and the plurality of second plate patterns 123 are disposed in the form of separate islands so that the plurality of first plate patterns 121 and the plurality of second plate patterns 123 may be individually isolated. Accordingly, the plurality of first plate patterns 121 and the plurality of second plate patterns 123 may be referred to as first island patterns and second island patterns or first individual patterns and second individual patterns. The first plate patterns 121 which are disposed to be spaced apart from each other may be connected by the first line patterns 122. In the non-active area NA, the second plate patterns 123 which are disposed to be spaced apart from each other may be connected by the second line patterns 124.

Specifically, the plurality of second plate patterns 123 disposed in the non-active area NA may include a plurality of first sub plate patterns 123a, a plurality of second sub plate patterns 123b, and a plurality of third sub plate patterns 123c. An anchor hole is disposed in the plurality of first sub plate patterns 123a, the gate driver GD is disposed on the plurality of second sub plate patterns 123b, and the power supply PS is disposed on the plurality of third sub plate patterns 123c.

To be more specific, as illustrated in FIG. 1, the plurality of first sub plate patterns 123a is disposed to be adjacent to the active area AA in a first direction (e.g., X-axis direction) and is disposed to be spaced apart from each other in a second direction (e.g., Y-axis direction). That is, the first sub plate patterns 123a may be disposed on both sides of the active area AA with respect to the first direction X. However, the present disclosure is not limited thereto, and the first sub plate patterns 123a may be disposed on only one side of the active area AA with respect to the first direction X. Further, an anchor hole which binds a plurality of connection lines may be disposed on the plurality of first sub plate patterns 123a.

The plurality of second sub plate patterns 123b is disposed to be adjacent to the plurality of first sub plate patterns 123a in the first direction X and is disposed to be spaced apart from the plurality of first sub plate patterns 123a in the second direction Y. That is, the plurality of second sub plate patterns 123b may be disposed on both sides of the plurality of first sub plate patterns 123a with respect to the first direction X. However, the present disclosure is not limited thereto and the second sub plate patterns 123b may be disposed on only one side of the plurality of first sub plate patterns 123a.

The gate driver GD may be mounted in the plurality of second sub plate patterns 123b. The gate driver GD may be formed on the second sub plate pattern 123b in a gate in panel (GIP) manner when various elements on the first plate pattern 121 are manufactured. Therefore, various circuit configurations which configure the gate driver GD, such as various transistors, capacitors, and wiring lines, may be disposed on the plurality of second sub plate patterns 123b. However, it is not limited thereto and the gate driver GD may be mounted in a chip on film (COF) manner.

Further, the plurality of third sub plate patterns 123c is disposed to be adjacent to the plurality of second sub plate patterns 123b in the first direction X and is disposed to be spaced apart from the plurality of second sub plate patterns 123b in the second direction Y. That is, the plurality of third sub plate patterns 123c may be disposed on both sides of the plurality of second sub plate patterns 123b with respect to the first direction X. However, it is not limited thereto and the plurality of third sub plate patterns 123c may be disposed on only one side of the plurality of second sub plate patterns 123b with respect to the first direction X. Further, the power supply PS may be mounted in the plurality of third sub plate patterns 123c. The power supply PS is a plurality of power blocks patterned when various components on the first plate pattern 121 is manufactured and may be formed on the third sub plate pattern 123c. Therefore, power blocks disposed on different layers may be disposed on the third sub plate pattern 123c.

Referring to FIG. 1, sizes of the plurality of first sub plate patterns 123a may be smaller than sizes of the plurality of first plate patterns 121. Specifically, a size of each of the plurality of first sub plate patterns 123a may be smaller than a size of each of the plurality of first plate patterns 121. As described above, the anchor hole AH is disposed in each of the plurality of first sub plate patterns 123a. The area occupied by the anchor hole AH is smaller than an area occupied by the pixel PX so that a size of each of the plurality of first sub plate patterns 123a may be smaller than a size of each of the plurality of first plate patterns 121.

Further, sizes of the plurality of second sub plate patterns 123b may be larger than sizes of the plurality of first plate patterns 121. Specifically, a size of each of the plurality of second sub plate patterns 123b may be larger than a size of each of the plurality of first plate patterns 121. As described above, the gate driver GD is disposed on each of the plurality of second sub plate patterns 123b and one stage of the gate driver GD is disposed in each of the plurality of second sub plate patterns 123b. Therefore, an area occupied by various circuit configurations which configure one stage of the gate driver GD may be relatively larger than an area occupied by the pixel PX so that a size of each of the plurality of second sub plate patterns 123b may be larger than a size of each of the plurality of first plate patterns 121.

Even though in FIG. 1, the plurality of second plate patterns 123 is disposed on both sides of the non-active area NA in the first direction X, it is not limited thereto and may be disposed in an arbitrary area of the non-active area NA. Further, even though it is illustrated that the plurality of first plate patterns 121 and the plurality of second plate patterns 123 have a quadrangular shape, it is not limited thereto and the shapes of the plurality of first plate patterns 121 and the plurality of second plate patterns 123 may vary in various forms.

Referring to FIGS. 1 and 3, the pattern layer 120 may include the plurality of first line patterns 122 disposed in the active area AA and the plurality of second line patterns 124 disposed in the non-active area NA.

The plurality of first line patterns 122 may be disposed in the active area AA. The plurality of first line patterns 122 is patterns which connect first plate patterns 121 which are adjacent to each other and is referred to as first connection patterns. That is, the plurality of first line patterns 122 is disposed between the plurality of first plate patterns 121.

The plurality of second line patterns 124 may be disposed in the non-active area NA. The plurality of second patterns 124 connect a first plate pattern 121 and a second plate pattern 123 which are adjacent to each other. For example, the plurality of second line patterns may connect a first plate pattern 121 located at an edge of the active area AA and a second plate pattern 123 located in an area adjacent to the first plate pattern 121 in the non-active area NA. Further, the plurality of second line patterns 124 may be patterns which connect the plurality of second plate patterns 123 which adjacent to each other. Accordingly, the plurality of second line patterns 124 may be referred to as second connection patterns. That is, the plurality of second line patterns 124 may be disposed between the first plate pattern 121 and the second plate pattern 123 which are adjacent to each other and the plurality of second plate patterns 123 which is adjacent to each other.

Referring to FIG. 1, the plurality of first line patterns 122 and second line patterns 124 have a wavy shape. For example, the plurality of first line patterns 122 and second line patterns 124 have a sinusoidal shape. However, the shape of the plurality of first line patterns 122 and second line patterns 124 is not limited thereto. For example, the plurality of first line patterns 122 and second line patterns 124 may extend in a zigzag pattern or may be formed with various shapes such as a shape extended by connecting a plurality of rhombus-shaped substrates at vertexes. Further, the number and the shape of the plurality of first line patterns 122 and second line patterns 124 illustrated in FIG. 1 are examples and may be changed in various forms depending on the design.

The plurality of first plate patterns 121, the plurality of first line patterns 122, the plurality of second plate patterns 123, and the plurality of second line patterns 124 are rigid patterns. That is, the plurality of first plate patterns 121, the plurality of first line patterns 122, the plurality of second plate patterns 123, and the plurality of second line patterns 124 may be rigider than the lower substrate 111 and the upper substrate 112. That is, moduli of elasticity of the plurality of first plate patterns 121, the plurality of first line patterns 122, the plurality of second plate patterns 123, and the plurality of second line patterns 124 may be higher than a modulus of elasticity of the lower substrate 111. The modulus of elasticity is a parameter representing a rate of deformation against the stress applied to the substrate and the higher the modulus of elasticity, the higher the hardness. Therefore, the plurality of first plate patterns 121, the plurality of first line patterns 122, the plurality of second plate patterns 123, and the plurality of second line patterns 124 may be referred to as a plurality of first rigid patterns, a plurality of second rigid patterns, a plurality of third rigid patterns, and a plurality of fourth rigid patterns, respectively. Moduli of elasticity of the plurality of first plate patterns 121, the plurality of first line patterns 122, the plurality of second plate patterns 123, and the plurality of second line patterns 124 may be 1000 times higher than the moduli of elasticity of the lower substrate 111 and the upper substrate 112, but is not limited thereto.

The plurality of first plate patterns 121, the plurality of first line patterns 122, the plurality of second plate patterns 123, and the plurality of second line patterns 124 which are a plurality of rigid substrates may be formed of a plastic material having a flexibility lower than that of the lower substrate 111 and the upper substrate 112. For example, the plurality of first plate patterns 121, the plurality of first line patterns 122, the plurality of second plate patterns 123, and the plurality of second line patterns 124 may be formed of polyimide (PI), polyacrylate, polyacetate, or the like. At this time, the plurality of first plate patterns 121, the plurality of first line patterns 122, the plurality of second plate patterns 123, and the plurality of second line patterns 124 may be formed of the same material, but is not limited thereto and may be formed of different materials.

In some embodiments, the lower substrate 111 may be defined to include a plurality of first lower patterns and second lower patterns. The plurality of first lower patterns is disposed in an area of the lower substrate 111 overlapping the plurality of first plate patterns 121 and the plurality of second plate patterns 123. The second lower pattern may be disposed in an area excluding an area where the plurality of first plate patterns 121 and the plurality of second plate patterns 123 are disposed or may be disposed in the entire display device 100.

Further, the upper substrate 111 is defined to include a plurality of first upper patterns and a second upper pattern. The plurality of first upper patterns is disposed in an area of the upper substrate 111 overlapping the plurality of first plate patterns 121 and the plurality of second plate patterns 123. The second upper pattern may be disposed in an area excluding an area where the plurality of first plate patterns 121 and the plurality of second plate patterns 123 are disposed or may be disposed in the entire display device 100.

At this time, moduli of elasticity of the plurality of first lower patterns and the first upper substrate may be higher than moduli of elasticity of the second lower pattern and the second upper pattern. For example, the plurality of first lower patterns and the first upper pattern may be formed of the same material as the plurality of first plate patterns 121 and the plurality of second plate patterns 123. The second lower pattern and the second upper pattern may be formed of a material having a modulus of elasticity lower than those of the plurality of first plate patterns 121 and the plurality of second plate patterns 123.

That is, the first lower pattern and the first upper pattern may be formed of polyimide (PI), polyacrylate, polyacetate, or the like. Further, the second lower pattern and the second upper pattern may be formed of silicon rubber such as polydimethylsiloxane (PDMS) or elastomer such as polyurethane (PU) or polytetrafluoroethylene (PTFE).

Driving Element of Non-Active Area

The gate driver GD is a component which supplies a gate voltage to the plurality of pixels PX disposed in the active area AA. The gate driver GD includes a plurality of stages formed on the second sub plate pattern 123b among the plurality of second plate patterns 123 and stages of the gate driver GD are electrically connected to each other by means of a plurality of gate connection lines. Accordingly, a gate voltage output from any one of stages may be transmitted to the other stage. Each stage may sequentially supply the gate voltage to the plurality of pixels PX connected to each stage.

The power supply PS is connected to the gate driver GD to supply a gate driving voltage and a gate clock voltage. Further, the power supply PS is connected to the plurality of pixels PX to supply a pixel driving voltage to each of the plurality of pixels PX. Further, the power supply PS may be formed on the third sub plate pattern 123c among the plurality of second plate patterns 123. That is, the power supply PS may be formed to be adjacent to the gate driver GD on the second plate pattern 123. Further, power supplies PS formed on the plurality of third sub plate patterns 123c are electrically connected to the gate driver GD and the plurality of pixels PX. That is, the plurality of power supplies PS formed on the plurality of third sub plate patterns 123c may be connected by a gate power supply connection line and a pixel power supply connection line. Therefore, each of the plurality of power supplies PS may supply a gate driving voltage, a gate clock voltage, and a pixel driving voltage.

The printed circuit board PCB is a component which transmits signals and voltages for driving the display element from the control unit to the display element. Therefore, the printed circuit board PCB may also be referred to as a driving substrate. A control unit such as an IC chip or a circuit unit may be mounted on the printed circuit board PCB. Further, on the printed circuit board PCB, a memory or a processor may also be mounted. Further, the printed circuit board 130 provided in the display device 100 may include a stretching area and a non-stretching area to ensure stretchability. Further, in the non-stretching area, an IC chip, a circuit unit, a memory, and a processor are mounted and in the stretching area, wiring lines which are electrically connected to the IC chip, the circuit unit, the memory, and the processor may be disposed.

The data driver DD is a component which supplies a data voltage to the plurality of pixels PX disposed in the active area AA. The data driver DD is configured as an IC chip so that it is also referred to as a data integrated circuit D-IC. Further, the data driver DD may be mounted in the non-stretching area of the printed circuit board PCB. That is, the data driver DD may be mounted on the printed circuit board PCB in the form of a chip on board (COB). However, even though in FIG. 1, it is illustrated that the data driver DD is mounted in a chip on board (COB) manner, it is not limited thereto and the data driver DD may be mounted by a chip on film (COF), a chip on glass (COG), or a tape carrier package (TCP) manner.

Further, even though in FIG. 1, one data driver DD is disposed so as to correspond to the first plate pattern 121 in one line disposed in the active area AA, it is not limited thereto. That is, one data driver DD may be disposed so as to correspond to the first plate patterns 121 in a plurality of columns.

Hereinafter, the active area AA of the display device 100 according to the embodiment of the present disclosure will be described in more detail with reference to FIGS. 4 and 5 together.

Planar and Cross-Sectional Structures of Active Area

Figure 4:
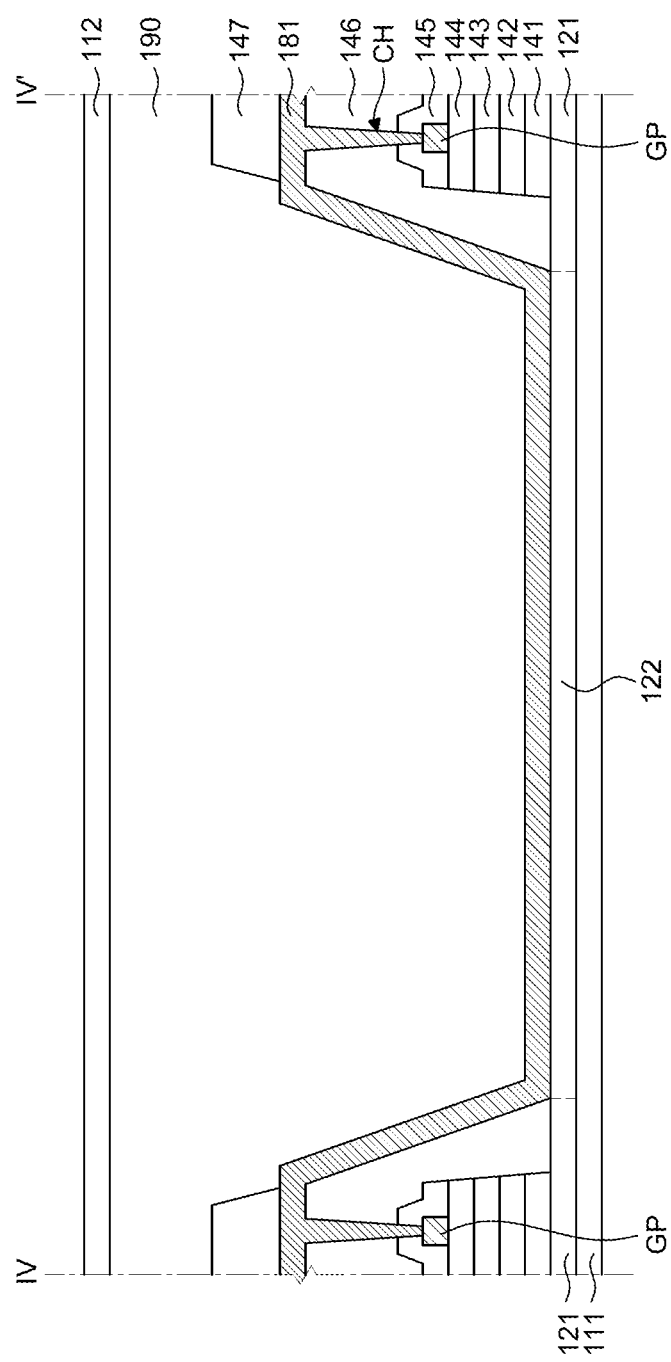
FIG. 4 is a cross-sectional view taken along the line IV-IV' of FIG. 2.

FIG. 4 is a cross-sectional view taken along the line IV-IV' of FIG. 2.

Figure 5:
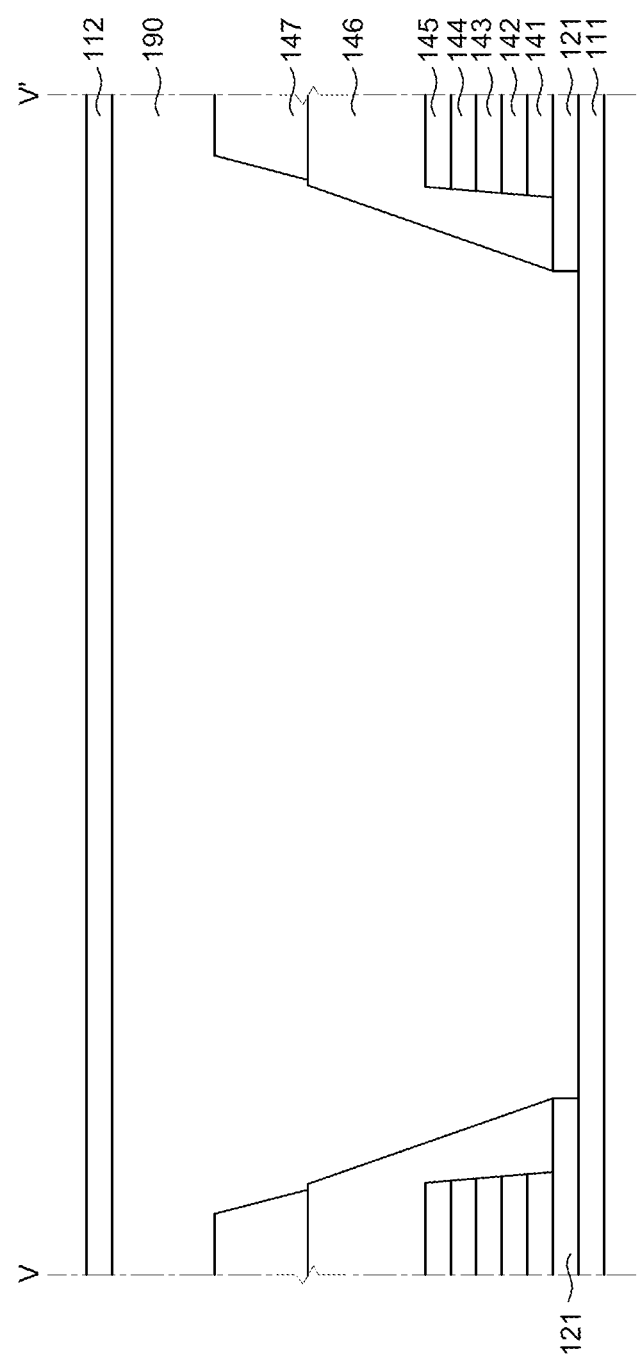
FIG. 5 is a cross-sectional view taken along the line V-V' of FIG. 2.

FIG. 5 is a cross-sectional view taken along the line V-V' of FIG. 2.

For the convenience of description, the description will be made also with reference to FIGS. 1 to 3 together.

Referring to FIGS. 1 and 2, the plurality of first plate patterns 121 is disposed on the lower substrate 111 in the active area AA. The plurality of first plate patterns 121 is spaced apart from each other to be disposed on the lower substrate 111. For example, as illustrated in FIG. 1, the plurality of first plate patterns 121 may be disposed on the lower substrate 111 in a matrix, but is not limited thereto.

Referring to FIGS. 2 and 3, a pixel PX including the plurality of sub pixels SPX is disposed in the first plate pattern 121. Further, each sub pixel SPX may include a light emitting diode 170 which is a display element and a driving transistor 160 and a switching transistor 150 which drive the light emitting diode 170. However, in the sub pixel SPX, the display element is not limited to the light emitting diode, and may also be changed to an organic light emitting diode. For example, the plurality of sub pixels SPX may include a red sub pixel, a green sub pixel, and a blue sub pixel, but is not limited thereto and colors of the plurality of sub pixels SPX may be modified to various colors as needed.

The plurality of sub pixels SPX may be connected to the plurality of pixel connection lines 181 and 182. That is, the plurality of sub pixels SPX may be electrically connected to the first pixel connection line 181 extending in the first direction X. Further, the plurality of sub pixels SPX may be electrically connected to the second pixel connection line 182 extending in the second direction Y.

In the meantime, the plurality of pixel connection lines 181 and 182 disposed in the active area AA may be referred to as first connection lines and a buffer line, a gate connection line, or a power line disposed in the non-active area NA may be referred to as a second connection line.

Hereinafter, a cross-sectional structure of the active area AA will be described in detail with reference to FIG. 3.

Referring to FIG. 3, a plurality of inorganic insulating layers is disposed on the plurality of first plate patterns 121. For example, the plurality of inorganic insulating layers may include a buffer layer 141, a gate insulating layer 142, a first interlayer insulating layer 143, a second interlayer insulating layer 144, and a passivation layer 145, but is not limited thereto. Therefore, on the plurality of first plate patterns 121, various inorganic insulating layers may be additionally disposed or one or more of the buffer layer 141, the gate insulating layer 142, the first interlayer insulating layer 143, the second interlayer insulating layer 144, and the passivation layer 145, which are inorganic insulating layers, may be omitted.

Specifically, the buffer layer 141 is disposed on the plurality of first plate patterns 121. The buffer layer 141 is formed on the plurality of first plate patterns 121 to protect various components of the display device 100 from permeation of moisture ($H_2O$) and oxygen ($O_2$) from the outside of the lower substrate 111 and the plurality of first plate patterns 121. The buffer layer 141 may be configured by an insulating material. For example, the buffer layer 141 may be configured by a single layer or a double layer formed of at least one of silicon nitride (SiNx), silicon oxide (SiOx), and silicon oxynitride (SiON). However, the buffer layer 141 may be omitted depending on a structure or a characteristic of the display device 100.

In the active area AA, the buffer layer 141 may be formed only in an area where the lower substrate 111 overlaps the plurality of first plate patterns 121. As described above, the buffer layer 141 may be formed of an inorganic material so that the buffer layer 141 may be easily cracked or damaged during a process of stretching the display device 100. Therefore, in the active area AA, the buffer layer 141 is not formed in an area between the plurality of first plate patterns 121, but is patterned to have a shape of the plurality of first plate patterns 121 to be formed only above the plurality of first plate patterns 121.

Further, in the non-active area NA, the buffer layer 141 may be formed only in an area where the lower substrate 111 overlaps the plurality of second plate patterns 123. As described above, the buffer layer 141 may be formed of an inorganic material so that the buffer layer 141 may be easily cracked or damaged during a process of stretching the display device 100. Therefore, in the non-active area NA, the buffer layer 141 is not formed in an area between the plurality of second plate patterns 123, but is patterned to have a shape of the plurality of second plate patterns 123 to be formed only above the plurality of second plate patterns 123.

As described above, the buffer layer 141 may be formed only in an area where the lower substrate 111 overlaps plurality of first plate patterns 121 and the plurality of second plate patterns 123. As described above, the buffer layer 141 may be formed of an inorganic material so that the buffer layer 141 may be easily cracked or damaged during a process of stretching the display device 100. Therefore, the buffer layer 141 is not formed in an area between the plurality of first plate patterns 121 and the plurality of second plate patterns 123. Instead, the buffer layer 141 is patterned to have a shape of the plurality of first plate patterns 121 and the plurality of second plate patterns 123 to be disposed only above the plurality of first plate patterns 121 and the plurality of second plate patterns 123. Therefore, in the display device 100 according to the embodiment of the present disclosure, the buffer layer 141 is formed only in an area overlapping the plurality of first plate patterns 121 and the plurality of second plate patterns 123 which are rigid patterns. Therefore, even though the display device 100 is bent or extended to be deformed, the damage of various components of the display device 100 may be suppressed.

Referring to FIG. 3, a switching transistor 150 including a gate electrode 151, an active layer 152, a source electrode 153, and a drain electrode 154 and a driving transistor 160 including a gate electrode 161, an active layer 162, a source electrode and a drain electrode 164 are formed on the buffer layer 141.

First, referring to FIG. 3, the active layer 152 of the switching transistor 150 and the active layer 162 of the driving transistor 160 are disposed on the buffer layer 141. For example, the active layer 152 of the switching transistor 150 and the active layer 162 of the driving transistor 160 may be formed of an oxide semiconductor. Alternatively, the active layer 152 of the switching transistor 150 and the active layer 162 of the driving transistor 160 may be formed of amorphous silicon (a-Si), polycrystalline silicon (poly-Si), an organic semiconductor, or the like.

The gate insulating layer 142 is disposed on the active layer 152 of the switching transistor 150 and the active layer 162 of the driving transistor 160. The gate insulating layer 142 is a layer which electrically insulates the gate electrode 151 of the switching transistor 150 from the active layer 152 of the switching transistor 150 and electrically insulates the gate electrode 161 of the driving transistor 160 from the active layer 162 of the driving transistor 160. Further, the gate insulating layer 142 may be formed of an insulating material. For example, the gate insulating layer 142 may be configured by a single layer of silicon nitride (SiNx) or silicon oxide (SiOx) which is an inorganic material or a multi-layer of silicon nitride (SiNx) or silicon oxide (SiOx), but it is not limited thereto.

The gate electrode 151 of the switching transistor 150 and the gate electrode 161 of the driving transistor 160 are disposed on the gate insulating layer 142. The gate electrode 151 of the switching transistor 150 and the gate electrode 161 of the driving transistor 160 are disposed on the gate insulating layer 142 to be spaced apart from each other. Further, the gate electrode 151 of the switching transistor 150 overlaps the active layer 152 of the switching transistor 150 and the gate electrode 161 of the driving transistor 160 overlaps the active layer 162 of the driving transistor 160.

The gate electrode 151 of the switching transistor 150 and the gate electrode 161 of the driving transistor 160 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

The first interlayer insulating layer 143 is disposed on the gate electrode 151 of the switching transistor 150 and the gate electrode 161 of the driving transistor 160. The first interlayer insulating layer 143 insulates the gate electrode 161 of the driving transistor 160 from an intermediate metal layer IM. The first interlayer insulating layer 143 may be formed of an inorganic material, similarly to the buffer layer 141. For example, the first interlayer insulating layer 143 may be configured by a single layer of silicon nitride (SiNx) or silicon oxide (SiOx) which is an inorganic material or a multi-layer of silicon nitride (SiNx) or silicon oxide (SiOx), but it is not limited thereto.

The intermediate metal layer IM is disposed on the first interlayer insulating layer 143. Further, the intermediate metal layer IM overlaps the gate electrode 161 of the driving transistor 160. Therefore, a storage capacitor is formed in an overlapping area of the intermediate metal layer IM and the gate electrode 161 of the driving transistor 160. Specifically, the gate electrode 161 of the driving transistor 160, the first interlayer insulating layer 143, and the intermediate metal layer IM form the storage capacitor. However, the placement area of the intermediate metal layer IM is not limited thereto and the intermediate metal layer IM overlaps the other electrode to form the storage capacitor in various forms.

The intermediate metal layer IM may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

The second interlayer insulating layer 144 is disposed on the intermediate metal layer IM. The second interlayer insulating layer 144 insulates the gate electrode 151 of the switching transistor 150 from the source electrode 153 and the drain electrode 154 of the switching transistor 150. Further, the second interlayer insulating layer 144 insulates the intermediate metal layer IM from the source electrode and the drain electrode 164 of the driving transistor 160. The second interlayer insulating layer 144 may be formed of an inorganic material, similarly to the buffer layer 141. For example, the first interlayer insulating layer 143 may be configured by a single layer of silicon nitride (SiNx) or silicon oxide (SiOx) which is an inorganic material or a multi-layer of silicon nitride (SiNx) or silicon oxide (SiOx), but it is not limited thereto.

The source electrode 153 and the drain electrode 154 of the switching transistor 150 are disposed on the second interlayer insulating layer 144. Further, the source electrode and the drain electrode 164 of the driving transistor 160 are disposed on the second interlayer insulating layer 144. The source electrode 153 and the drain electrode 154 of the switching transistor 150 are disposed on the same layer to be spaced apart from each other. Further, even though in FIG. 3, the source electrode of the driving transistor 160 is omitted, the source electrode of the driving transistor 160 is also disposed to be spaced apart from the drain electrode 164 on the same layer. In the switching transistor 150, the source electrode 153 and the drain electrode 154 may be in contact with the active layer 152 to be electrically connected to the active layer 152. Further, in the driving transistor 160, the source electrode and the drain electrode 164 may be in contact with the active layer 162 to be electrically connected to the active layer 162. Further, the drain electrode 154 of the switching transistor 150 is in contact with the gate electrode 161 of the driving transistor 160 through a contact hole to be electrically connected to the gate electrode 161 of the driving transistor 160.

The source electrode 153 and the drain electrodes 154 and 164 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

Further, in this specification, even though it is described that the driving transistor 160 has a coplanar structure, various transistors such as a staggered structure may also be used.

A gate pad GP and a data pad DP may be disposed on the second interlayer insulating layer 144.

Specifically, referring to FIG. 4, the gate pad GP is a pad which transmits a gate voltage to the plurality of sub pixels SPX. The gate pad GP is connected to the first pixel connection line 181 through a contact hole CH. Further, the gate voltage supplied from the first pixel connection line 181 may be transmitted to the gate electrode 151 of the switching transistor 150 from the gate pad GP through a wiring line formed on the first plate pattern 121.

Further, the data pad DP is a pad which transmits a data voltage to the plurality of sub pixels SPX. The data pad DP is connected to the second pixel connection line 182 through a contact hole. Further, the data voltage supplied from the second pixel connection line 182 may be transmitted to the source electrode 153 of the switching transistor 150 from the data pad DP through a wiring line formed on the first plate pattern 121.

The gate pad GP and the data pad DP may be formed of the same material as the source electrode 153 and the drain electrodes 154 and 164, but are not limited thereto.

Referring to FIG. 3, the passivation layer 145 is formed on the switching transistor 150 and the driving transistor 160. That is, the passivation layer 145 covers the switching transistor 150 and the driving transistor 160 to protect the switching transistor 150 and the driving transistor 160 from the permeation of moisture and oxygen. The passivation layer 145 may be formed of an inorganic material and configured by a single layer or a double layer, but is not limited thereto.

Further, the gate insulating layer 142, the first interlayer insulating layer 143, the second interlayer insulating layer 144, and the passivation layer 145 are patterned to be formed only in an area overlapping the plurality of first plate patterns 121. The gate insulating layer 142, the first interlayer insulating layer 143, the second interlayer insulating layer 144, and the passivation layer 145 may be also formed of the inorganic material, similarly to the buffer layer 141. Therefore, the gate insulating layer 142, the first interlayer insulating layer 143, the second interlayer insulating layer 144, and the passivation layer 145 may also be easily cracked to be damaged during the process of stretching the display device 100. Therefore, the gate insulating layer 142, the first interlayer insulating layer 143, the second interlayer insulating layer 144, and the passivation layer 145 are not formed in an area between the plurality of first plate patterns 121. However, the gate insulating layer 142, the first interlayer insulating layer 143, the second interlayer insulating layer 144, and the passivation layer 145 are patterned to have a shape of the plurality of first plate patterns 121 to be formed only above the plurality of first plate patterns 121.

The planarization layer 146 is formed on the passivation layer 145. The planarization layer 146 planarizes upper portions of the switching transistor 150 and the driving transistor 160. The planarization layer 146 may be configured by a single layer or a plurality of layers and may be formed of an organic material. Therefore, the planarization layer 146 may also be referred to as an organic insulating layer. For example, the planarization layer 146 may be formed of an acrylic-based organic material, but is not limited thereto.

Referring to FIG. 3, the planarization layer 146 may be disposed so as to cover upper layers and side layers of the buffer layer 141, the gate insulating layer 142, the first interlayer insulating layer 143, the second interlayer insulating layer 144, and the passivation layer 145 on the plurality of first plate patterns 121. Further, the planarization layer 146 encloses the buffer layer 141, the gate insulating layer 142, the first interlayer insulating layer 143, the second interlayer insulating layer 144, and the passivation layer 145 together with the plurality of first plate patterns 121. Specifically, the planarization layer 146 may be disposed so as to cover a top surface and a side surface of the passivation layer 145, a side surface of the first interlayer insulating layer 143, a side surface of the second interlayer insulating layer 144, a side surface of the gate insulating layer 142, a side surface of the buffer layer 141, and a part of a top surface of the plurality of first plate patterns 121. Therefore, the planarization layer 146 may compensate for a step on the side surfaces of the buffer layer 141, the gate insulating layer 142, the first interlayer insulating layer 143, the second interlayer insulating layer 144, and the passivation layer 145. Further, the planarization layer 145 may enhance an adhesive strength of the planarization layer 145 and the pixel connection lines 181 and 182 disposed on the side surface of the planarization layer 146.

Referring to FIG. 3, an inclination angle of the side surface of the planarization layer 146 may be smaller than an inclination angle formed by side surfaces of the buffer layer 141, the gate insulating layer 142, the first interlayer insulating layer 143, the second interlayer insulating layer 144, and the passivation layer 145. For example, the side surface of the planarization layer 146 may have a slope which is gentler than a slope formed by the side surface of the passivation layer 145, the side surfaces of the first interlayer insulating layer 143 and the second interlayer insulating layer 144, the side surface of the gate insulating layer 142, and the side surface of the buffer layer 141. Therefore, the pixel connection lines 181 and 182 which are disposed to be in contact with the side surface of the planarization layer 146 is disposed with a gentle slope so that when the display device 100 is stretched, a stress generated in the pixel connection lines 181 and 182 is reduced. Further, the crack caused in the pixel connection lines 181 and 182 or a separation from the side surface of the planarization layer 146 may be suppressed.

Referring to FIGS. 2 to 4, the pixel connection lines 181 and 182 refer to wiring lines which electrically connect the pads on the plurality of first plate patterns 121. The pixel connection lines 181 and 182 are disposed on the plurality of first line patterns 122. The pixel connection lines 181 and 182 may extend onto the plurality of first plate patterns 121 to be electrically connected to the gate pad GP and the data pad DP on the plurality of first plate patterns 121. Referring to FIG. 5, the first line pattern 122 is not disposed in an area where the pixel connection lines 181 and 182 are not disposed, among areas between the plurality of first plate patterns 121.

The pixel connection lines 181 and 182 include a first pixel connection line 181 and a second pixel connection line 182. The first pixel connection line 181 and the second pixel connection line 182 are disposed between the plurality of first plate patterns 121. Specifically, the first pixel connection line 181 refers to a wiring line extending in the X-axis direction between the plurality of first plate patterns 121, among the pixel connection lines 181 and 182. The second pixel connection line 182 refers to a wiring line extending in the Y-axis direction between the plurality of first plate patterns 121, among the pixel connection lines 181 and 182.

The pixel connection lines 181 and 182 may be formed of a metal material such as copper (Cu), aluminum (Al), titanium (Ti), and molybdenum or a stacked structure of metal materials such as copper/molybdenum-titanium (Cu/Moti) or titanium/aluminum/titanium (Ti/Al/Ti), but is not limited thereto.

In the case of a general display device, various wiring lines such as a plurality of gate lines and a plurality of data lines extend between the plurality of sub pixels in a straight line shape and the plurality of sub pixels is connected to one signal line. Therefore, in the general display device, various wiring lines, such as a gate line, a data line, a high potential power line, and a reference voltage line, extend from one side to the other side of the organic light emitting display device without being disconnected on the substrate.

In contrast, in the display device 100 according to the embodiment of the present disclosure, various wiring lines, such as a gate line, a data line, a high potential power line, or a reference voltage line having a straight line shape which are considered to be used for the general organic light emitting display device, may be disposed only on the plurality of first plate patterns 121 and the plurality of second plate patterns 123. That is, in the display device 100 according to the embodiment of the present disclosure, a linear wiring line may be disposed only on the plurality of first plate patterns 121 and the plurality of second plate patterns 123.

In the display device 100 according to the embodiment of the present disclosure, in order to connect discontinuous wiring lines on the first plate patterns 121 or the second plate patterns 123, pads on two adjacent first plate patterns 121 or two adjacent second plate patterns 123 may be connected by the pixel connection lines 181 and 182. That is, the pixel connection lines 181 and 182 electrically connect the gate pads GP or the data pads DP on two adjacent first plate patterns 121. Accordingly, the display device 100 according to the embodiment of the present disclosure may include a plurality of pixel connection lines 181 and 182 which electrically connects various wiring lines, such as a gate line, a data line, a high potential power line, and a reference voltage line, between the plurality of first plate patterns 121 and the plurality of second plate patterns 123. For example, the gate line may be disposed on the plurality of first plate patterns 121 disposed to be adjacent to each other in the X-axis direction and the gate pad GP may be disposed on both ends of the gate line. In this case, the plurality of gate pads GP on the plurality of first plate patterns 121 adjacent to each other in the first direction X may be connected to each other by the first pixel connection line 181 which serves as a gate line. Therefore, the gate line disposed on the plurality of first plate patterns 121 and the first pixel connection line 181 disposed on the second plate pattern 123 may serve as one gate line. Further, wiring lines which extend in the first direction X, among all various wiring lines which are included in the display device 100, such as an emission signal line, a low potential power line, and a high potential power line, may also be electrically connected by the first pixel connection line 181, as described above.

Referring to FIGS. 2 and 4, the first pixel connection lines 181 may connect the gate pads GP on two first plate patterns 121 which are disposed side by side, among the gate pads GP on the plurality of first plate patterns 121 disposed to be adjacent in the first direction X. The first pixel connection line 181 may serve as a gate line, an emission signal line, a high potential power line, or a low potential power line, but is not limited thereto. For example, the first pixel connection line 181 may serve as a gate line and electrically connect the gate pads GP on two first plate patterns 121 which are disposed side by side in the first direction X. Therefore, as described above, the gate pads GP on the plurality of first plate patterns 121 disposed in the first direction X may be connected by the first pixel connection line 181 serving as a gate line and transmit one gate voltage.

Further, referring to FIG. 3, the second pixel connection lines 182 may connect the data pads DP on two first plate patterns 121 which are disposed side by side, among the data pads DP on the plurality of first plate patterns 121 disposed to be adjacent in the second direction Y. The second pixel connection line 182 may serve as a data line, a high potential power line, a low potential power line, or a reference voltage line, but is not limited thereto. For example, the second pixel connection line 182 may serve as a data line and electrically connect the data line on two first plate patterns 121 which are disposed side by side in the second direction Y. Therefore, as described above, the internal line on the plurality of first plate patterns 121 disposed in the second direction Y may be connected by the plurality of second pixel connection line 182 serving as a data line and transmit one data voltage.

As illustrated in FIG. 4, the first pixel connection line 181 may be formed to extend to a top surface of the first line pattern 122 while being in contact with a top surface and a side surface of the planarization layer 146 disposed on the first plate pattern 121. Further, as illustrated in FIG. 3, the second pixel connection line 182 is formed to extend to a top surface of the first line pattern 122 while being in contact with a top surface and a side surface of the planarization layer 146 disposed on the first plate pattern 121.

However, as illustrated in FIG. 5, there is no need to dispose a rigid pattern in an area where the first pixel connection line 181 and the second pixel connection line 182 are not disposed. Therefore, the first line pattern 122 which is a rigid pattern is not disposed below the first pixel connection line 181 and the second pixel connection line 182.

In the meantime, referring to FIG. 3, a bank 147 is formed on the connection pad CNT, the pixel connection lines 181 and 182, and the planarization layer 146. The bank 147 is a component which divides adjacent sub pixels SPX. The bank 147 is disposed so as to cover at least a part of the pad PD, the pixel connection lines 181 and 182, and the planarization layer 146. The bank 147 may be formed of an insulating material. Further, the bank 147 may include a black material. The bank 147 includes the black material to block wiring lines which are visible through the active area AA. For example, the bank 147 may be formed of a transparent carbon-based mixture and specifically, include carbon black. However, it is not limited thereto and the bank 147 may be formed of a transparent insulating material. Further, even though in FIG. 3, it is illustrated that a height of the bank 147 is lower than a height of the light emitting diode 170, the present disclosure is not limited thereto and the height of the bank 147 may be equal to the height of the light emitting diode 170.

Referring to FIG. 3, the light emitting diode 170 is disposed on the connection pad CNT and the first pixel connection line 181. The light emitting diode 170 includes an n-type layer 171, an active layer 172, a p-type layer 173, an n-electrode 174, and a p-electrode 175. The light emitting diode 170 of the display device 100 according to the embodiment of the present disclosure has a flip-chip structure in which the n-electrode 174 and the p-electrode 175 are formed on one surface.

The n-type layer 171 may be formed by injecting an n-type impurity into gallium nitride (GaN) having excellent crystallinity. The n-type layer 171 may be disposed on a separate base substrate which is formed of a material which is capable of emitting light.

The active layer 172 is disposed on the n-type layer 171. The active layer 172 is a light emitting layer which emits light in the light emitting diode 170 and may be formed of a nitride semiconductor, for example, indium gallium nitride (InGaN). The p-type layer 173 is disposed on the active layer 172. The p-type layer 173 may be formed by injecting a p-type impurity into gallium nitride (GaN).

As described above, the light emitting diode 170 according to the embodiment of the present disclosure may be manufactured by sequentially laminating the n-type layer 171, the active layer 172, and the p-type layer 173, and then etching a predetermined part to form the n-electrode 174 and the p-electrode 175. In this case, the predetermined part which is a space for separating the n-electrode 174 and the p-electrode 175 from each other may be etched to expose a part of the n-type layer 171. In other words, the surfaces of the light emitting diode 170 on which the n-electrode 174 and the p-electrode 175 are disposed are not flat surfaces, but have different heights.

As described above, the n-electrode 174 is disposed in the etched area and is formed of a conductive material. Further, the p-electrode 175 is disposed in an area which is not etched and is also formed of a conductive material. For example, the n-electrode 174 is disposed on the n-type layer 171 which is exposed by the etching process and the p-electrode 175 is disposed on the p-type layer 173. The p-electrode 175 may be formed of the same material as the n-electrode 174.

An adhesive layer AD is disposed on top surfaces of the connection pad CNT and the first pixel connection line 181 and between the connection pad CNT and the first pixel connection line 181 so that the light emitting diode 170 may be adhered onto the connection pad CNT and the first pixel connection line 181. At this time, the n-electrode 174 is disposed on the first pixel connection line 181 and the p-electrode 175 may be disposed on the connection pad CNT.

The adhesive layer AD may be a conductive adhesive layer in which conductive balls are dispersed in an insulating base member. Therefore, when heat or a pressure is applied to the adhesive layer AD, the conductive balls are electrically connected in a portion applied with the heat or pressure to have a conductive property and an area which is not pressurized may have an insulation property. For example, the n-electrode 174 is electrically connected to the first pixel connection line 181 by means of the adhesive layer AD and the p-electrode 175 is electrically connected to the connection pad CNT by means of the adhesive layer AD. After applying the adhesive layer AD onto the top surface of the first pixel connection line 181 and the connection pad CNT by an inkjet method, the light emitting diode 170 is transferred onto the adhesive layer AD and is pressurized and heated. By doing this, the connection pad CNT is electrically connected to the p-electrode and the first pixel connection line 181 is electrically connected to the n-electrode 174. However, the remaining part of the adhesive layer AD excluding a part of the adhesive layer AD disposed between the n-electrode 174 and the first pixel connection pad 181 and a part of the adhesive layer AD disposed between the p-electrode 175 and the connection pad CNT has an insulation property. In the meantime, the adhesive layer AD may be divided to be disposed on the connection pad CNT and the first pixel connection line 181, respectively.

Further, the connection pad CNT is electrically connected to the drain electrode 164 of the driving transistor 160 to be applied with a driving voltage from the driving transistor 160 to drive the light emitting diode 170. Further, a low potential driving voltage is applied to the first pixel connection line 181 to drive the light emitting diode 170. Therefore, when the display device 100 is turned on, different voltage levels applied to the connection pad CNT and the first pixel connection line 181 are transmitted to the n-electrode 174 and the p-electrode 175 so that the light emitting diode 170 emits light.

The upper substrate 112 is a substrate which supports various components disposed below the upper substrate 112. Specifically, the upper substrate 112 is formed by coating a material which configures the upper substrate 112 on the lower substrate 111 and the first plate pattern 121 and then hardening the material to be in contact with the lower substrate 111, the first plate pattern 121, the first line pattern 122, and the pixel connection lines 181 and 182.

The upper substrate 112 may be formed of the same material as the lower substrate 111. For example, the upper substrate 112 may be formed of a silicon rubber such as polydimethylsiloxane (PDMS) or an elastomer such as polyurethane (PU) or polytetrafluoroethylene (PTFE) and thus have a flexible property. However, the material of the upper substrate 112 is not limited thereto.

In the meantime, even though not illustrated in FIG. 3, a polarization layer may be disposed on the upper substrate 112. The polarization layer may perform a function which polarizes light incident from the outside of the display device 100 to reduce the external light reflection. Further, an optical film other than the polarization layer may be disposed on the upper substrate 112.

Further, the filling layer 190 may be disposed on the entire surface of the lower substrate 111 to be filled between the components disposed on the upper substrate 112 and the lower substrate 111. The filling layer 190 may be configured by a curable adhesive. Specifically, the material which configures the filling layer 190 is coated on the entire surface of the lower substrate 111 and then is hardened so that the filling layer 190 may be disposed between the components disposed on the upper substrate 112 and the lower substrate 111. For example, the filling layer 190 may be an optically clear adhesive (OCA) and may be configured by an acrylic adhesive, a silicon-based adhesive, and a urethane-based adhesive.

Circuit Structure of Active Area

Figure 6:
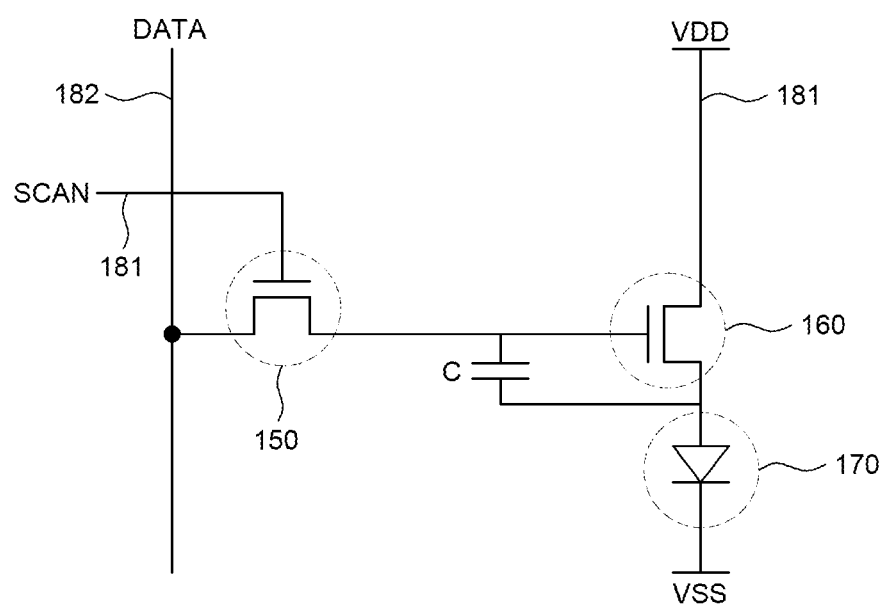
FIG. 6 is a circuit diagram of a sub pixel of a display device according to an embodiment of the present disclosure.

FIG. 6 is a circuit diagram of a sub pixel of a display device according to an embodiment of the present disclosure.

Hereinafter, for the convenience of description, a structure and an operation when a sub pixel SPX of a display device according to the embodiment of the present disclosure is a pixel circuit with 2T (transistor) 1C (capacitor) will be described, but the present disclosure is not limited thereto.

Referring to FIGS. 3 and 6, a sub pixel SPX of the display device according to the embodiment of the present disclosure may be configured to include a switching transistor 150, a driving transistor 160, a storage capacitor C, and a light emitting diode 170.

The switching transistor 150 applies a data signal DATA supplied through the second pixel connection line 182 to the driving transistor 160 and the storage capacitor C in accordance with a gate signal SCAN supplied through the first pixel connection line 181.

Further, a gate electrode 151 of the switching transistor 150 is electrically connected to the first pixel connection line 181, a source electrode 153 of the switching transistor 150 is connected to the second pixel connection line 182, and a drain electrode 154 of the switching transistor 150 is connected to the gate electrode 161 of the driving transistor 160.

The driving transistor 160 may operate so as to allow a driving current in accordance with the high potential power VDD supplied through the first pixel connection line 181 and the data voltage DATA to flow in response to the data voltage DATA stored in the storage capacitor C.

Further, a gate electrode 161 of the driving transistor 160 is electrically connected to the drain electrode 154 of the switching transistor 150, a source electrode of the driving transistor 160 is connected to the first pixel connection line 181, and a drain electrode 164 of the driving transistor 160 is connected to the light emitting diode 170.

The light emitting diode 170 may operate to emit light in accordance with a driving current formed by the driving transistor 160. Further, as described above, the n-electrode 174 of the light emitting diode 170 is connected to the first pixel connection line 181 to be applied with the low potential power VSS. The p-electrode 174 of the light emitting diode 170 is connected to the drain electrode 164 of the driving transistor 160 to be applied with a driving voltage corresponding to the driving current.

As described above, the sub pixel SPX of the display device according to the embodiment of the present disclosure is configured by a 2T1C structure including the switching transistor 150, the driving transistor 160, the storage capacitor C, and the light emitting diode 170. However, when a compensation circuit is added, the sub pixel may be configured in various ways, such as 3T1C, 4T2C, 5T2C, 6T1C, 6T2C, 7T1C, or 7T2C.

As described above, the display device according to the embodiment of the present disclosure includes a plurality of sub pixels on a first substrate which is rigid substrate and each of the plurality of sub pixels SPX includes a switching transistor, a driving transistor, a storage capacitor, and a light emitting diode.

Accordingly, the display device according to the embodiment of the present disclosure may not only be stretched by the lower substrate, but also include a pixel circuit with a 2T1C structure on each first substrate to emit light according to the data voltage in accordance with each gate timing.

Pattern Layer of Non-Active Area

Figure 7:
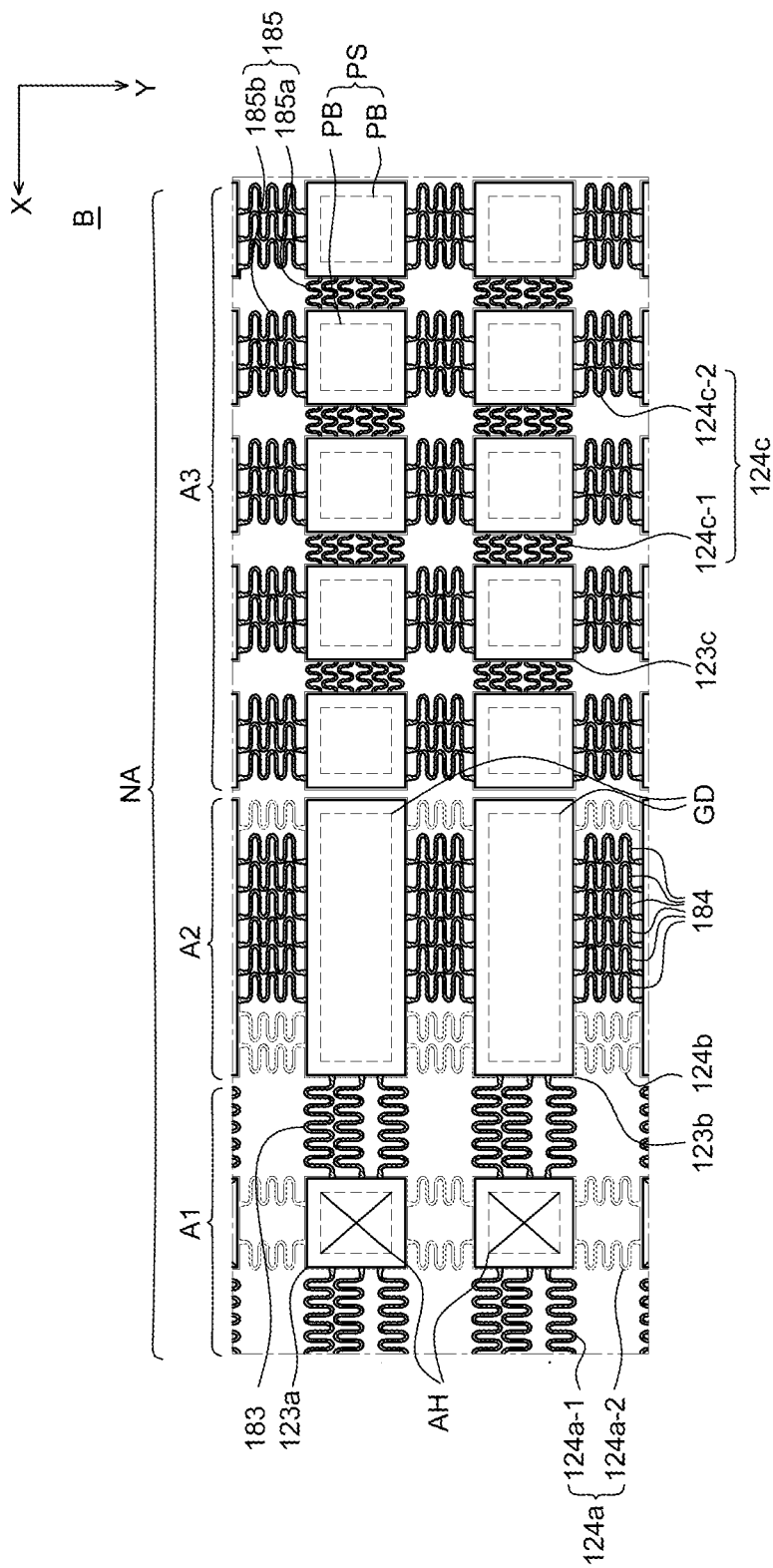
FIG. 7 is an enlarged plan view of a non-active area of a display device according to an embodiment of the present disclosure.

FIG. 7 is an enlarged plan view of a non-active area of a display device according to an embodiment of the present disclosure.

Specifically, FIG. 7 is an enlarged plan view of an area B illustrated in FIG. 1. For reference, in FIG. 7, a thin wavy line indicates that only a second line pattern is disposed and a bold wavy line indicates that a buffer line, a gate connection line, or a power line which is a second connection line is disposed on the second line pattern.

As illustrated in FIG. 7, the non-active area NA includes a first area A1 located at the outside of the active area AA, a second area A2 located at the outside of the first area A1, and a third area A3 located at the outside of the second area A2. For example, the non-active area NA includes the first area A1 adjacent to the active area AA, the second area A2 adjacent to the first area A1, and the third area A3 adjacent to the second area A2. The second area A2 is disposed between the first area A1 and the third area A3.

An anchor hole AH is disposed in the first area A1, a gate driver GD is disposed in the second area A2, and a power block (PB) which configures a power supply PS is disposed in the third area A3.

The first area A1, the second area A2, and the third area A3 are sequentially disposed at the outside of the active area AA with respect to the first direction X. Therefore, the anchor hole AH, the gate driver GD, and the power supply PS are sequentially disposed in an area adjacent to the active area AA with respect to the first direction X.

The plurality of second plate patterns 123 in which the gate driver GD and the power supply PS are formed may be disposed in the non-active area NA. A second line pattern 124 which connects the first plate pattern 121 and the second plate pattern 123 which are adjacent to each other and connects the plurality of second plate patterns 123 which is adjacent to each other is disposed. The second line pattern 124 may be referred to as a second connection pattern. For example, the second line pattern 124 may be disposed between the first plate pattern 121 and the second plate pattern 123 which are adjacent to each other and the second line pattern 124 may be disposed between the plurality of second plate patterns 123 which is adjacent to each other.

Specifically, the plurality of second plate patterns 123 disposed in the non-active area NA includes a plurality of first sub plate patterns 123a located in the first area A1, a plurality of second sub plate patterns 123b located in the second area A2, and a plurality of third sub plate patterns 123c located in a third area A3. In the plurality of first sub plate patterns 123a, an anchor hole AH is disposed, in the plurality of second sub plate patterns 123b, the gate driver GD is disposed, and in the plurality of third sub plate patterns 123c, the power supply PS is disposed.

To be more specific, at one side of the non-active area NA, the plurality of first sub plate patterns 123a is disposed in one line along the second direction Y in the first area A1 and the plurality of second sub plate patterns 123b is disposed in one line along the second direction Y in the second area A2. The plurality of third sub plate patterns 123c is disposed in a plurality of columns along the second direction Y in the third area A3.

For example, the plurality of first sub plate patterns 123a is disposed in the first area A1 and is spaced apart from each other only in the second direction Y and the plurality of second sub plate patterns 123b is disposed in the second area A2 and is spaced apart from each other only in the second direction Y. Further, the plurality of third sub plate patterns 123c is disposed in the third area A3 and may be spaced apart from each other in the first direction X and the second direction Y.

Sizes of the plurality of first sub plate patterns 123a may be smaller than sizes of the plurality of second sub plate patterns 123b. Specifically, a size of each of the plurality of first sub plate patterns 123a may be smaller than a size of each of the plurality of second sub plate patterns 123b. As described above, the anchor hole AH may be disposed in each of the plurality of first sub plate patterns 123a. An area of the anchor hole AH disposed in the plurality of first sub plate patterns 123a may be smaller than an area of the gate driver GD disposed in the plurality of second sub plate patterns 123b.

The plurality of second line patterns 124 disposed in the non-active area NA includes a first sub line pattern 124a disposed in the first area A1, a second sub line pattern 124b disposed in the second area A2, and a third sub line pattern 124c disposed in the third area A3.

The first sub line pattern 124a may connect the first plate pattern 121 disposed in the active area AA and the first sub plate pattern 123a of the second plate pattern 123 disposed in the non-active area NA. Further, the first sub line pattern 124a connects the first sub plate pattern 123a and the second sub plate pattern 123b disposed in the non-active area NA.

To be more specific, the first sub line pattern 124a may include a 1-1-th sub line pattern 124a-1 and a 1-2-th sub line pattern 124a-2. The 1-1-th sub line pattern 124a-1 extends in the first direction X, connects the first plate pattern 121 and the first sub plate pattern 123a, and may connect the first sub plate pattern 123a and the second sub plate pattern 123b. Further, the 1-2-th sub line pattern 124a-2 extends to the 1-1-th sub line pattern 124a-1 and the second direction Y and may connect the plurality of first sub plate patterns 123a.

The second sub line pattern 124b extends in the second direction Y and connects the plurality of second sub plate patterns 123b.

Further, the third sub line pattern 124c includes a 3-1-th sub line pattern 124c-1 and a 3-2-th sub line pattern 124c-2. The 3-1-th sub line pattern 124c-1 extends in the first direction X and may connect the third sub plate patterns 123c which are spaced apart in the first direction X. Further, the 3-2-th sub line pattern 124c-2 extends in the second direction Y and may connect the plurality of third sub plate patterns 123c which are spaced apart in the second direction Y.

In the meantime, the plurality of gate connection lines 184 is disposed on the second sub line patterns 124b disposed in the second area A2 to electrically connect the plurality of gate drivers GD. That is, a gate driving voltage and a gate clock voltage are applied to the plurality of gate connection lines 184 disposed on the second sub line pattern 124b to allow each of the plurality of gate drivers GD to output a gate voltage. However, even though in FIG. 7, it is illustrated that the gate connection lines 184 are disposed only in some of the plurality of second sub line patterns 124b, the present disclosure is not limited thereto and the gate connection lines 184 may be disposed in all the plurality of second sub line patterns 124b.

Further, the gate connection line 184 formed on the second sub line pattern 124b may have the same shape as the second sub line pattern 124b. Specifically, the plurality of gate connection lines 184 may have wavy shapes. For example, the plurality of gate connection lines 184 may have a sinusoidal shape, respectively. However, the shape of the plurality of gate connection line 184 is not limited thereto and for example, the plurality of gate connection lines 184 may extend in a zigzag pattern or may be formed with various shapes such as a shape extended by connecting a plurality of rhombus-shaped substrates at vertexes. Further, the number and the shape of the plurality of gate connection lines 184 illustrated in FIG. 8 are illustrative and the number and the shape of the plurality of gate connection lines 184 may vary depending on the design.

However, in FIG. 7, the gate connection line 184 are disposed on not all the second sub line patterns 124b, but there may be a second sub line patterns 124b on which the gate connection line 184 is not disposed. The second sub line pattern 124b on which the gate connection line 184 is not disposed may be a structure which is additionally disposed to ensure the rigidity for the stretching in the second direction Y.

Configuration of First Area

Figure 8:
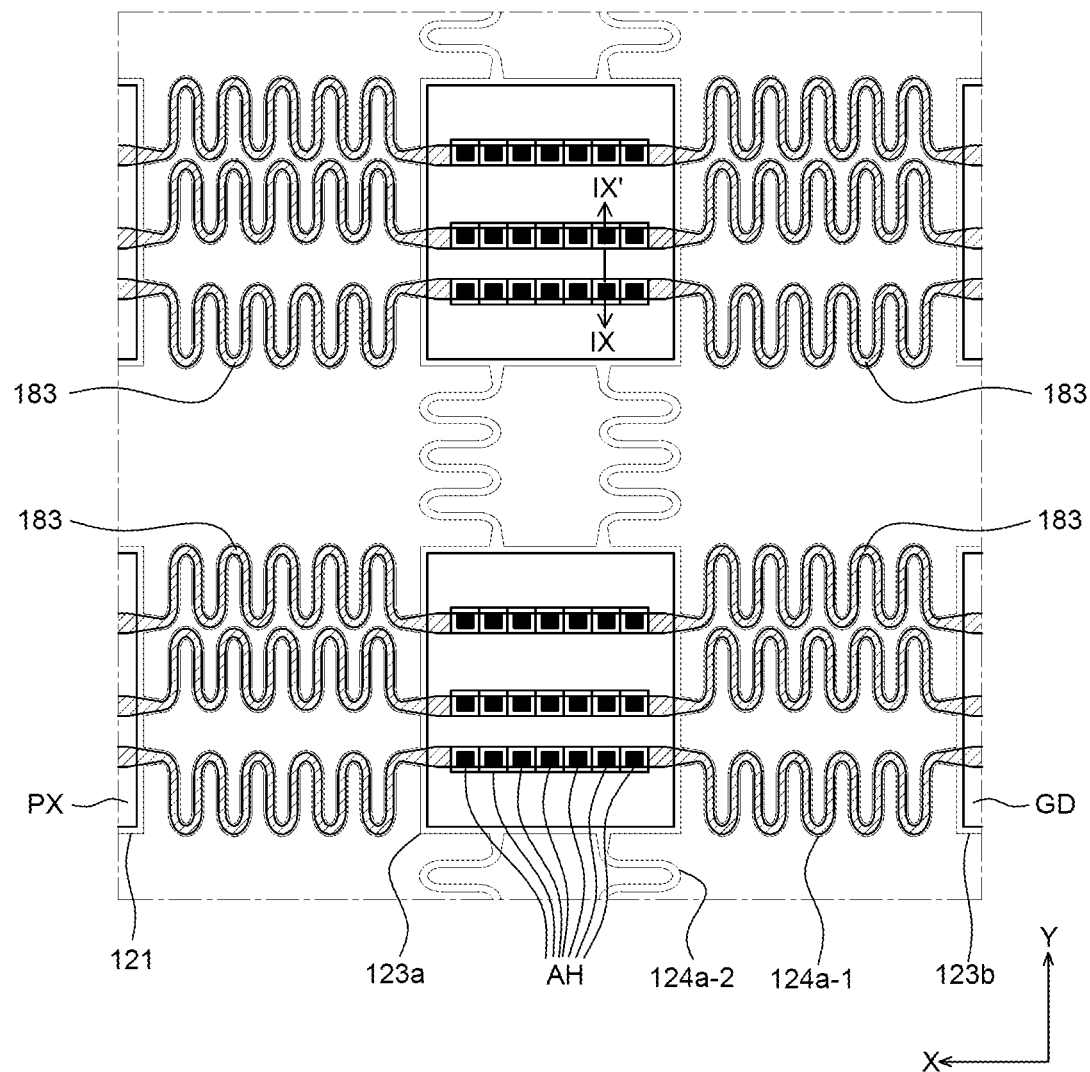
FIG. 8 is an enlarged plan view of a first area of a display device according to an embodiment of the present disclosure.

FIG. 8 is an enlarged plan view of a first area of a display device according to an embodiment of the present disclosure.

Figure 9:
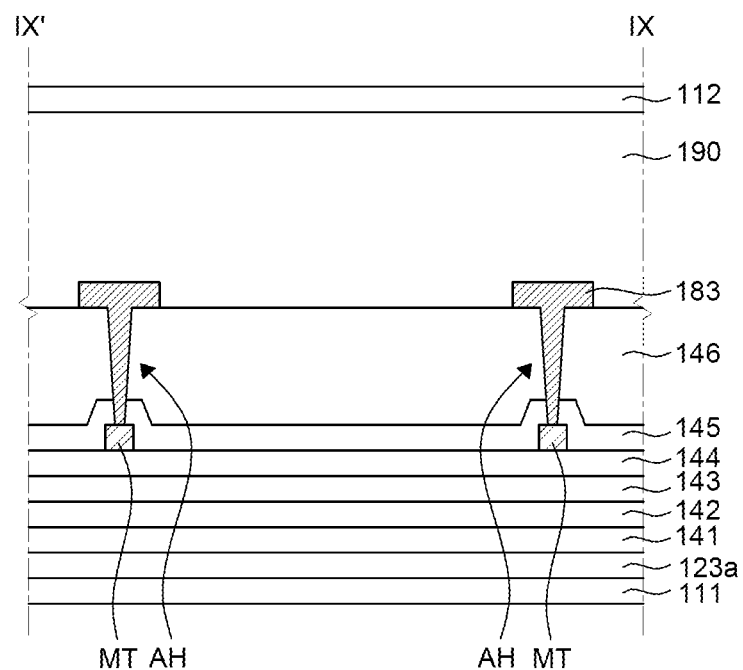
FIG. 9 is a cross-sectional view taken along the line IX-IX' of FIG. 8.

FIG. 9 is a cross-sectional view taken along the line IX-IX' of FIG. 8.

As illustrated in FIG. 8, in the first area A1, a buffer line 183 which connects the gate driver GD and the plurality of pixels PX is disposed. Further, in the first area A1, an anchor hole AH which fixes the buffer line 183 may be disposed. For example, the buffer line 183 is disposed on the first sub line pattern 124a which connects the first plate pattern 121 and the first sub plate pattern 123a to connect the gate driver GD disposed in the first sub plate pattern 123a and the pixel PX disposed in the first plate pattern 121.

Further, referring to FIG. 8, a width of both ends of the 1-1-th sub line pattern 124a-1 located between the first plate pattern 121 and the first sub plate pattern 123a may be larger than a width of a center area of the 1-1-th sub line pattern 124a-1. Further, a width of both ends of the 1-1-th sub line pattern 124a-1 located between the first sub plate pattern 123a and the second sub plate pattern 123b may be larger than a width of a center area of the 1-1-th sub line pattern 124a-1.

Accordingly, in the buffer line 183 formed on the 1-1-th sub line pattern 124a-1, a width of the buffer line 183 disposed in an area overlapping the first plate pattern 121, the first sub plate pattern 123a, or the second sub plate pattern 123b may be larger than a width of the buffer line 183 disposed in an area overlapping the 1-1-th sub line pattern 124a-1.

That is, the width of the center area of the buffer line 183 is relatively thin so that the buffer line 183 may be stretched by a less force. Therefore, the stretchability of the buffer line 183 may be improved. Further, since the widths of both ends of the buffer line 183 are relatively thick, an area of the buffer line 183 which is in contact with the first plate pattern 121, the first sub plate pattern 123a, or the second sub plate pattern 123b to be fixed may be increased. Therefore, even though the buffer line 183 is repeatedly stretched, the buffer line may not be separated from the first plate pattern 121, the first sub plate pattern 123a, or the second sub plate pattern 123b. Therefore, the stretching reliability of the buffer line 183 may be improved.

Each buffer line 183 extends in the first direction X to connect the gate driver GD and the plurality of pixels PX and the plurality of buffer lines 183 is disposed in the second direction Y.

Further, the plurality of buffer lines 183 is disposed over the first sub plate pattern 123a and the first sub line pattern 124a. Specifically, the first sub line pattern 124a is configured by the 1-1-th sub line pattern 124a-1 extending in the first direction X and the 1-2-th sub line pattern 124a-2 extending in the second direction Y, but the buffer line 183 extends only in the first direction X. Therefore, the buffer lines 183 are disposed on the first sub plate pattern 123a and the 1-1-th sub line pattern 124a-1. Further, the buffer line 183 may not be formed on the 1-2-th sub line pattern 124a-2. Further, the buffer line 183 formed on the 1-1-th sub line pattern 124a-1 may have the same shape as the 1-1-th sub line pattern 124a-1. Specifically, each of the plurality of buffer lines 183 has a wavy shape. For example, the plurality of buffer lines 183 may have a sinusoidal shape. However, the shape of the plurality of buffer lines 183 is not limited thereto. For example, the plurality of buffer lines 183 may extend with a zigzag pattern or may be formed with various shapes such as a shape extended by connecting a plurality of rhombus-shaped substrates at vertexes. Further, the number and the shape of the plurality of buffer lines 183 illustrated in FIG. 8 are illustrative and the number and the shape of the plurality of buffer lines 183 may vary depending on the design.

Further, the buffer line 183 formed on the first sub plate pattern 123a may be a straight line extending in the first direction X. However, the shape of the buffer line 183 formed on the first sub plate pattern 123a is not limited thereto and may have the wavy shape as described above. A width of the buffer line 183 formed on the first sub plate pattern 123a may be larger than a width of the buffer line 183 formed on the 1-1-th sub line pattern 124a-1. Referring to FIG. 8, the widths of the 1-1-th sub line patterns 124a-1 may vary. For example, the width of the 1-1-th sub line pattern 124a-1 disposed in an area adjacent to the first sub plate pattern 123a or the first plate pattern 121 may be larger than a width of the wavy area of the 1-1-th sub line pattern 124a-1.

Therefore, some of the plurality of buffer lines 183 has a wavy shape so that the first area A1 of the non-active area NA may be stretched in the first direction X. Further, the others of the plurality of buffer lines 183 have a linear shape so that the resistance of the buffer line 183 may be reduced. Therefore, the delay of the gate voltage which is transmitted by the plurality of buffer lines 183 may be reduced or minimized.

Further, the plurality of anchor holes AH is formed on the first sub plate pattern 123a to allow the plurality of buffer lines 183 to be in contact with the metal pattern MT (or conductive pattern MT) disposed on a different layer.

As illustrated in FIG. 8, the plurality of anchor holes AH may be formed so as to overlap the buffer line 183 formed on the first sub plate pattern 123a. Specifically, the buffer line 183 formed on the first sub plate pattern 123a extends in the first direction X so that the plurality of anchor holes AH may be disposed in the first direction X along the buffer line 183 formed on the first sub plate pattern 123a.

For example, the plurality of buffer lines 183 extending in the first direction X is disposed in the second direction Y on the first sub plate pattern 123a so that the plurality of anchor holes AH disposed in the first direction X may be disposed in the second direction Y.

Further, referring to FIG. 9, the plurality of buffer lines 183 may be in direct contact with the other metal pattern MT by means of the plurality of anchor holes AH.

The buffer layer 141, the gate insulating layer 142, the first interlayer insulating layer 143, the second interlayer insulating layer 144, and the passivation layer 145 which are inorganic insulating layers and the planarization layer 146 which is an organic insulating layer may be disposed on the first sub plate patterns 123a disposed on the lower substrate 111.

Further, the buffer line 183 is disposed on the planarization layer 146 and the metal pattern MT may be disposed between the buffer layer 141, the gate insulating layer 142, the first interlayer insulating layer 143, the second interlayer insulating layer 144, and the passivation layer 145 which are inorganic insulating layers.

For example, in FIG. 9, the metal pattern MT may be formed of the same material as the source electrode and the drain electrode of the transistor disposed between the second interlayer insulating layer 144 and the passivation layer 145. That is, the metal pattern MT may be formed of the same material on the same layer as the source electrode and the drain electrode of the transistor.

However, the metal pattern MT is not limited thereto and the metal pattern MT may be formed of the same material as the intermediate metal layer disposed between the first interlayer insulating layer 143 and the second interlayer insulating layer 144. Alternatively, the metal pattern MT may be formed of the same material as the gate electrode of the transistor disposed between the gate insulating layer 142 and the first interlayer insulating layer 143.

Further, the filling layer 190 and the upper substrate 112 may be sequentially disposed on the buffer line 183 and the planarization layer.

As described above, the display device according to the embodiment of the present disclosure may include the anchor hole AH which fixes the buffer line 183. Therefore, even though the display device is repeatedly stretched, the buffer line 183 may not be separated from the lower components. Further, the buffer line 183 is fixed onto the first sub plate pattern 123a by means of the anchor hole AH so that an area where the buffer line 183 flexibly moves may be reduced. Therefore, a stretching stress applied to the buffer line 183 may be surely reduced. As a result, the anchor hole AH is formed in the display device according to the embodiment of the present disclosure, the stretching reliability of the display device may be stably ensured.

Further, when the display device is manufactured, the component is disposed on the lower substrate and is lifted-off to be separated and then the filling layer and the upper substrate are adhered. As described above, when the components disposed on the lower substrate are lifted off, there is a problem in that the buffer line which is a component disposed on the lower substrate is torn out. Therefore, in the display device according to the present disclosure, the buffer line is fixed by the anchor hole so that the display device is not damaged during the lift-off. As a result, the display device according to the embodiment of the present disclosure may also achieve the process stability.

Configuration of Third Area

Figure 10:
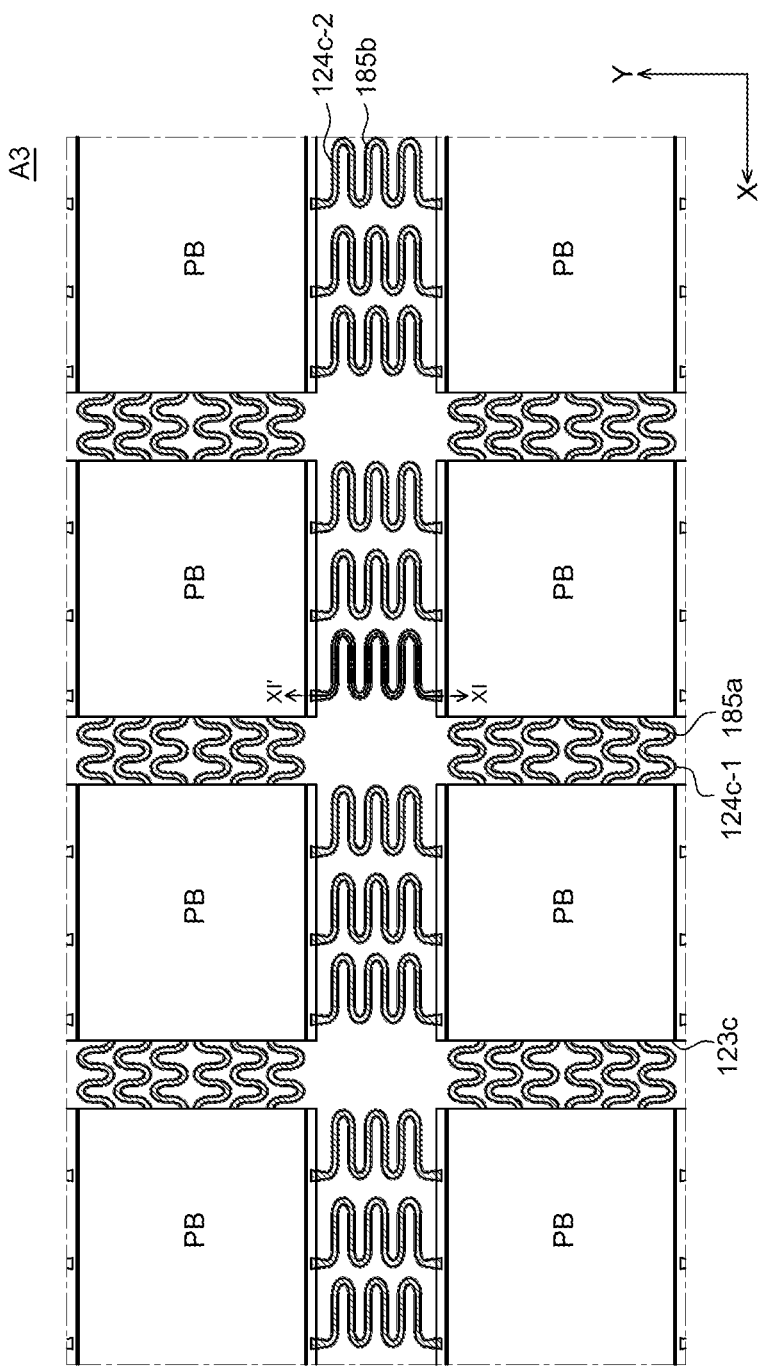
FIG. 10 is an enlarged plan view of a third area of a display device according to an embodiment of the present disclosure.

FIG. 10 is an enlarged plan view of a third area of a display device according to an embodiment of the present disclosure.

Figure 11:
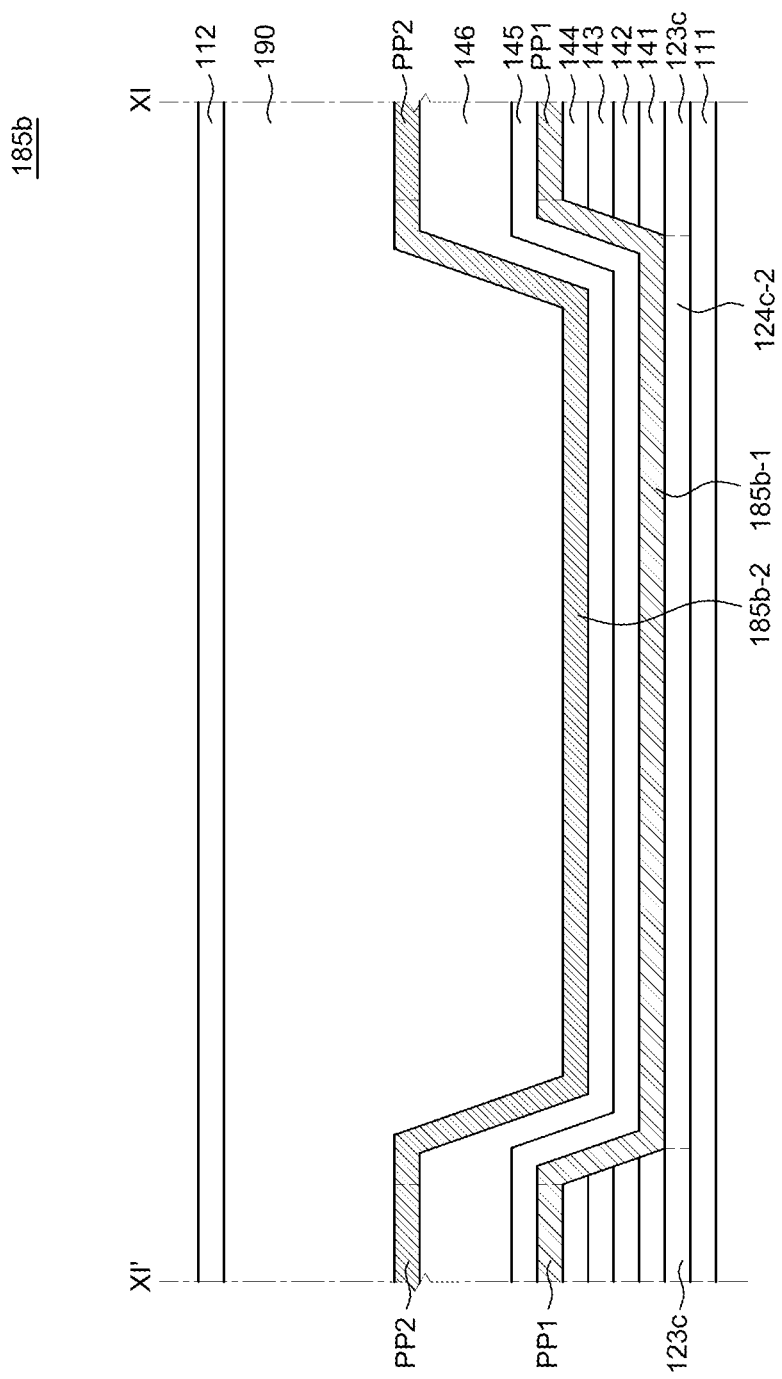
FIG. 11 is a cross-sectional view taken along the line XI-XI' of FIG. 10.

FIG. 11 is a cross-sectional view taken along the line XI-XI' of FIG. 10.

As illustrated in FIG. 10, in the third area A3, a plurality of power blocks PB which configures the power supply PS and a power line 185 which connects the plurality of power blocks PB are disposed.

The plurality of power blocks PB is formed on the plurality of third sub plate patterns 123c which is spaced apart from each other, respectively. As described above, the third sub plate patterns 123c may be formed by island shapes which are spaced apart from each other in the first direction X and the second direction Y. Therefore, the plurality of power blocks PB may be also disposed to have island shapes which are spaced apart from each other in the first direction X and the second direction Y.

Even though in FIG. 10, a plurality of power blocks PB disposed in a 4×2 matrix which is disposed in the plurality of third sub plate patterns 123c disposed in the 4×2 matrix has been illustrated, the present disclosure is not limited thereto and the plurality of power blocks PB may be disposed in various forms. For example, not only one power block PB is disposed in one third sub plate pattern 123c, but also the plurality of power blocks PB may be disposed in a matrix.

Further, as illustrated in FIG. 11, each of the plurality of power blocks PB may include a plurality of power patterns PP disposed on different layers. Specifically, the plurality of power blocks PB may include a first power pattern PP1 and a second power pattern PP2 disposed on different layers.

The buffer layer 141, the gate insulating layer 142, the first interlayer insulating layer 143, the second interlayer insulating layer 144, and the passivation layer 145 which are inorganic insulating layers and the planarization layer 146 which is an organic insulating layer may be disposed on the third sub plate pattern 123c disposed on the lower substrate 111.

Further, the first power pattern PP1 may be disposed between the buffer layer 141, the gate insulating layer 142, the first interlayer insulating layer 143, the second interlayer insulating layer 144, and the passivation layer 145 which are inorganic insulating layers. Further, the second power pattern PP2 may be disposed on the planarization layer 146.

For example, in FIG. 11, the first power pattern PP1 may be formed of the same material as the source electrode and the drain electrode of the transistor disposed between the second interlayer insulating layer 144 and the passivation layer 145. That is, the first power pattern PP1 may be formed of the same material on the same layer as the source electrode and the drain electrode of the transistor.

However, the first power pattern PP1 is not limited thereto and the first power pattern PP1 may be formed of the same material as the intermediate metal layer disposed between the first interlayer insulating layer 143 and the second interlayer insulating layer 144. Alternatively, the first power pattern PP1 may be formed of the same material as the gate electrode of the transistor disposed between the gate insulating layer 142 and the first interlayer insulating layer 143.

However, even though in FIG. 11, it is illustrated that the power block PB is configured by only two power patterns PP1 and PP2, the present disclosure is not limited thereto and the power block PB may be configured by three or more power pattern layers disposed on different layers of the power block PB.

Further, the filling layer 190 and the upper substrate 112 may be sequentially disposed on the second power pattern PP2 and the planarization layer.

The plurality of power lines 185 connects the plurality of power blocks PB disposed in the form of islands. Therefore, the plurality of power lines 185 includes a first power line 185a extending in the first direction X and the second power line 185b extending in the second direction Y.

The plurality of first power lines 185a extending in the first direction X is disposed on the 3-1-th sub line pattern 124c-1 extending in the first direction X and the plurality of second power lines 185b extending in the second direction Y is disposed on the 3-2-th sub line pattern 124c-2 extending in the second direction Y.

Further, the first power line 185a formed on the 3-1-th sub line pattern 124c-1 may have the same shape as the 3-1-th sub line pattern 124c-1 and the second power line 185b formed on the 3-2-th sub line pattern 124c-2 may have the same shape as the 3-2-th sub line pattern 124c-2. Specifically, the plurality of first power lines 185a and the plurality of second power lines 185b have wavy shapes. For example, the plurality of first power lines 185a and the plurality of second power lines 185b have sinusoidal shapes. However, the shape of the plurality of first power lines 185a and the plurality of second power lines 185b is not limited thereto. For example, the plurality of first power lines 185a and the plurality of second power lines 185b may extend in a zigzag pattern or may be formed with various shapes such as a shape extended by connecting a plurality of rhombus-shaped substrates at vertexes. Further, in FIG. 10, it is illustrated that six first power lines 185a form a group and electrically connect the plurality of power blocks PB which is adjacent in the first direction X and three second power lines 185b form a group and electrically connect the plurality of power blocks PB which is adjacent in the second direction Y. However, the number and the shape of the plurality of first power lines 185a and the plurality of second power lines 185b which are illustrated are illustrative and the number and the shape of the plurality of first power lines 185a and the plurality of second power lines 185b may vary depending on the design.

Further, as illustrated in FIG. 11, each of the plurality of first power lines 185a and the plurality of second power lines 185b may include a plurality of power line layers disposed on different layers. Specifically, the plurality of first power lines 185a may include a 1-1-th power line and a 1-2-th power line disposed on different layers. The plurality of second power lines 185b may include a 2-1-th power line 185b-1 and a 2-2-th power line 185b-2 disposed on different layers.

FIG. 11 is a cross sectional view of the second power line 185b so that an interlayer structure of the second power line 185b will be described.

The 2-1-th power line 185b-1 is disposed on the 3-2-th sub line pattern 124c-2 disposed on the lower substrate 111. The passivation layer 145 and the planarization layer 146 are disposed on the 2-1-th power line 185b-1 and the 2-2-th power line 185b-2 is disposed on the planarization layer 146.

The 2-1-th power line 185b-1 may be configured by the same material as the first power pattern PP1 and the 2-2-th power line 185b-2 may be configured by the same material as the second power pattern PP2.

For example, in FIG. 11, the 2-1-th power line 185b-1 may be formed of the same material as the source electrode and the drain electrode of the transistor. However, the 2-1-th power line 185b-1 is not limited thereto and the 2-1-th power line 185b-1 may be formed of the same material as the intermediate metal layer disposed between the first interlayer insulating layer 143 and the second interlayer insulating layer 144. Alternatively, the 2-1-th power line 185b-1 may be formed of the same material as the gate electrode of the transistor disposed between the gate insulating layer 142 and the first interlayer insulating layer 143.

However, even though in FIG. 11, it is illustrated that the second power line 185b is configured by only two power line layers 185b-1 and 185b-2, the present disclosure is not limited thereto and may be configured by three or more power line layers disposed on different layers of the second power line 185b.

The interlayer structure of the first power line 185a is the same as the interlayer structure of the second power line 185b.

Specifically, the 1-1-th power line may be disposed on the 3-1-th sub line pattern 124c-1 disposed on the lower substrate 111. Further, the passivation layer 145 and the planarization layer 146 are disposed on the 1-1-th power line and the 1-2-th power line is disposed on the planarization layer 146.

The 1-1-th power line may be configured by the same material as the first power pattern PP1 and the 2-2-th power line may be configured by the same material as the second power pattern PP2.

Even though it is illustrated that the first power line 185a is configured by only two power line layers, the present disclosure is not limited thereto and may be configured by three or more power line layers disposed on different layers of the first power line 185a.

As described above, the 1-1-th power line and the 2-1-th power line 185b-1 are configured by the same material as the first power pattern PP1 so that the 1-1-th power line, the 2-1-th power line 185b-1, and the first power pattern PP1 may be electrically connected to each other. Therefore, a low potential driving voltage may be applied to the plurality of first power patterns PP1 disposed at one side by means of the link line. The low potential driving voltage is stored in the first power pattern PP1 disposed at the other side by means of the 1-1-th power line and the 2-1-th power line 185b-1 and is supplied to the plurality of pixels by means of the 1-1-th power line and the 2-1-th power line 185b-1.

The 1-2-th power line and the 2-2-th power line 185b-2 are configured by same material as the second power pattern PP2 so that the 1-2-th power line, the 2-2-th power line 185b-2, and the second power pattern PP2 may be electrically connected to each other. Therefore, a high potential driving voltage may be applied to the plurality of second power patterns PP2 disposed at one side by means of the link line. The high potential driving voltage is stored in the second power pattern PP2 disposed at the other side by means of 1-2-th power line and the 2-2-th power line 185b-2 and is supplied to the plurality of pixels by means of the 1-2-th power line and the 2-2-th power line 185b-2.

That is, as described above, the high potential driving voltage is supplied to the pixel by means of the 1-2-th power line, the 2-2-th power line 185b-2, and the second power pattern PP2 which are components on a relatively upper layer of the power supply PS. Further, the low high potential driving voltage is supplied to the pixel by means of the 1-1-th power line, the 2-1-th power line 185b-1, and the first power pattern PP1 which are components on a relatively lower layer of the power supply PS.

However, the present disclosure is not limited thereto. Therefore, the high potential driving voltage may be supplied to a component disposed in one area among the 1-2-th power line, the 2-2-th power line 185b-2, and the second power pattern PP2 which are components on a relatively upper layer of the power supply PS by means of the link line. Further, the low potential driving voltage is supplied to a component disposed in the other area of the 1-2-th power line, the 2-2-th power line 185*b*-2, and the second power pattern PP2 by means of the link line. The second power pattern PP2 disposed in the other area is electrically connected to the first power pattern PP1 disposed on the relatively lower layer by means of the contact hole. Therefore, the low potential driving voltage is stored in the 1-1-th power line, the 2-1-th power line 185*b*-1, and the first power pattern PP1 so that the low potential driving voltage is supplied to the pixels by means of the 1-1-th power line, the 2-1-th power line 185*b*-1, and the first power pattern PP1.

For example, as illustrated in FIG. 10, when the power block PB is disposed in a 4×2 matrix, the second power pattern PP2 of the power block PB in a 2×2 matrix which is disposed relatively at an inner side of the third area A3 is applied with the high potential driving voltage from the link line to apply the high potential driving voltage to the pixel by means of the power line 185.

In the meantime, the second power pattern PP2 of the power block PB in a 2×2 matrix which is disposed relatively at an outer side of the third area A3 is applied with the low potential driving voltage from the link line. Further, the low potential driving voltage is transmitted to the first power pattern PP1 of the power block PB in a 4×2 matrix disposed over the third area A3, by means of the contact hole. Further, the low potential driving voltage may be applied to the pixel by means of the power line 185 connected to the first power pattern PP1.

In the above description, the high potential driving voltage is applied to the power block PB in the 2×2 matrix disposed at the inner side of the third area A3 and the low potential driving voltage is applied to the power block PB in the 2×2 matrix disposed at the outer side of the third area A3. Therefore, the power block PB in the 2×2 matrix disposed at the inner side of the third area A3 and the power block PB in the 2×2 matrix disposed at the outer side of the third area A3 should not be electrically connected. Therefore, the power line 185 may not be disposed between the power block PB in the 2×2 matrix disposed at the inner side of the third area A3 and the power block PB in the 2×2 matrix disposed at the outer side of the third area A3.

As described above, in the display device according to the embodiment of the present disclosure, the power supplies PS may be formed on the plurality of third sub plate patterns 123*c* which is spaced apart from each other in the form of islands. That is, the power supply PS includes the power blocks PB which are spaced apart from each other in a biaxial direction and a power line 185 connecting them so that the power supply PS itself may be stretched not only in the first direction X, but also in the second direction Y. Accordingly, the non-active area NA of the display device according to the embodiment of the present disclosure is also biaxially stretched. Accordingly, the applicable range of the stretchable display device is expanded so that the applicability of the stretchable display device may be improved. Further, the stretching direction of the stretchable display device is expanded so that the stretching stress which is applied in one direction may be significantly reduced. Therefore, the stretchability of the display device according to the embodiment of the present disclosure may be improved. Further, different voltages are applied to the upper layer and the lower layer of the power supply of the display device so that various types of driving voltages may be applied in a space where the power supply is limited. Further, a plurality of power lines of the power supply is connected in parallel to reduce or minimize the drop of the driving voltage to be transmitted.

Another Embodiment of Present Disclosure-Additional Power Block

Hereinafter, a display device 200 according to another embodiment of the present disclosure will be described in detail. The display device 200 according to another embodiment of the present disclosure has a difference in the additional power block disposed in the third area, as compared with the display device 100 according to the embodiment of the present disclosure. Therefore, a repeated description of the display device according to another embodiment of the present disclosure and the display device according to one embodiment of the present disclosure will be omitted and the above-described difference will be specifically described.

Figure 12:
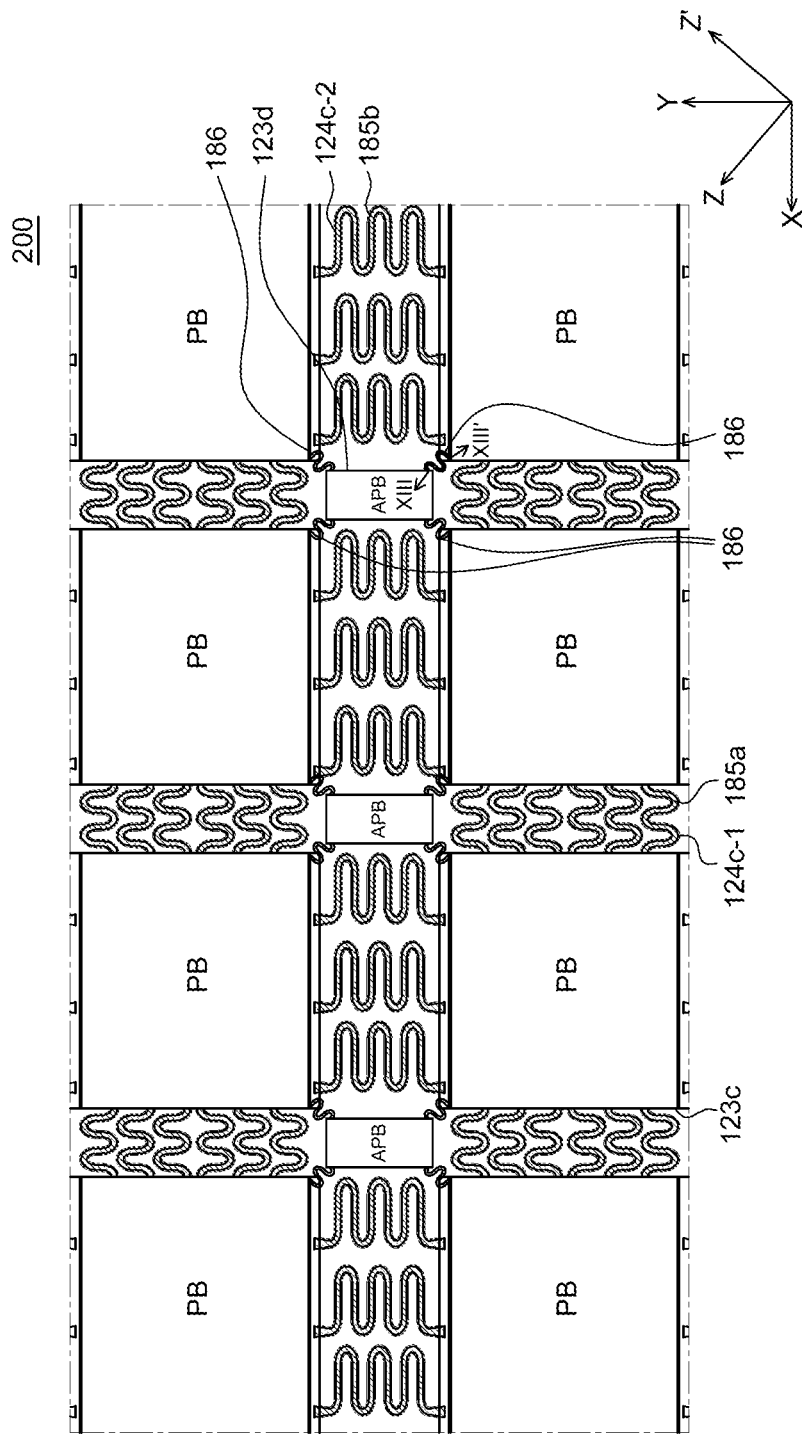
FIG. 12 is an enlarged plan view of a third area of a display device according to another embodiment of the present disclosure.

FIG. 12 is an enlarged plan view of a third area of a display device according to another embodiment of the present disclosure.

Figure 13:
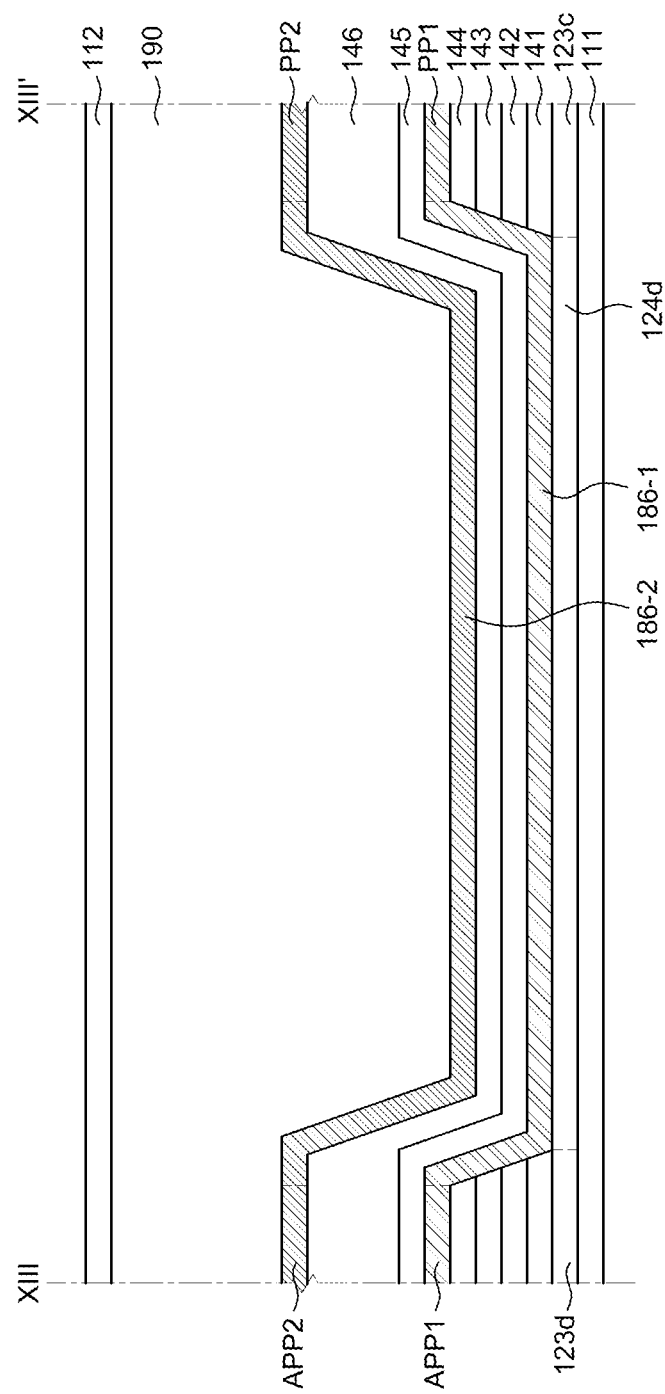
FIG. 13 is a cross-sectional view taken along the line XIII-XIII' of FIG. 12.

FIG. 13 is a cross-sectional view taken along the line XIII-XIII' of FIG. 12.

A display device 200 according to another embodiment of the present disclosure further includes a plurality of additional power blocks APB (or a plurality of supplementary power blocks APB) disposed on a fourth sub plate pattern 123*d* (or a fourth sub plate structure 123*d*) and additional power lines 186 which connects the additional power blocks APB.

As illustrated in FIG. 12, in the third area of the non-active area of the display device 200 according to another embodiment of the present disclosure, the plurality of power blocks PB which configures the power supply PS and the power lines 185 which connects the plurality of power blocks PB. Further, the plurality of additional power blocks APB and the additional power lines 186 which connects the additional power blocks APB may be disposed. In some embodiments, the plurality of additional power blocks APB and the additional power lines 186 are also part of the power supply circuit PS.

The plurality of additional power blocks APB is formed on the plurality of fourth sub plate patterns 123*d* which is spaced apart from each other. As described above, the fourth sub plate pattern 123*d* may be disposed between the plurality of third sub plate patterns 123*c* disposed in third directions Z and Z'. Further, the fourth sub plate patterns 123*d* may be also disposed in the form of islands which are spaced apart from each other in the first direction X and the second direction Y. Accordingly, the plurality of additional power blocks APB may be also disposed in the form of islands which are spaced apart from each other in the first direction X and the second direction Y.

In other words, referring to FIG. 12, the plurality of additional power blocks APB is disposed between the plurality of power blocks PB disposed in the third directions Z and Z' or disposed between the plurality of first power lines 185*a*, or between the plurality of second power lines 185*b*.

The above-described fourth sub plate pattern 123*d* is a component of the second plate pattern so that the fourth sub plate pattern 123*d* may be a quadrangular rigid pattern.

Even though in FIG. 12, one additional power block APB is illustrated for each fourth sub plate pattern 123*d*, the present disclosure is not limited thereto and the placement type of the additional power block APB may vary in various forms. For example, not only one additional power block APB is disposed in one fourth sub plate pattern 123*d*, but the plurality of additional power blocks APB may be disposed in a matrix.

Referring to FIG. 13, each of the plurality of additional power blocks APB may include a plurality of additional power patterns APP1 and APP2 disposed on different layers. Specifically, the plurality of additional power blocks APB may include a first additional power pattern APP1 and a second additional power pattern APP2 disposed on different layers.

The first additional power pattern APP1 may be formed of the same material on the same layer as the first power pattern PP1 and the second additional power pattern APP2 may be formed of the same material on the same layer as the second power pattern PP2.

The first additional power pattern APP1 may be disposed between the buffer layer 141, the gate insulating layer 142, the first interlayer insulating layer 143, the second interlayer insulating layer 144, and the passivation layer 145 which are inorganic insulating layers. The second additional power pattern APP2 is disposed on the planarization layer 146.

For example, the first additional power pattern APP1 may be formed of the same material as the source electrode and the drain electrode of the transistor disposed between the second interlayer insulating layer 144 and the passivation layer 145. That is, the first additional power pattern APP1 may be formed of the same material on the same layer as the source electrode and the drain electrode of the transistor.

However, the first additional power pattern APP1 is not limited thereto and the first power pattern PP1 may be formed of the same material as the intermediate metal layer disposed between the first interlayer insulating layer 143 and the second interlayer insulating layer 144. Alternatively, the first additional power pattern APP1 may be formed of the same material as the gate electrode of the transistor disposed between the gate insulating layer 142 and the first interlayer insulating layer 143.

However, even though in FIG. 13, it is illustrated that the additional power block APB is configured by only two additional power patterns PP1 and PP2, the present disclosure is not limited thereto. Therefore, the additional power block APB may be configured by three or more additional power pattern layers disposed on different layers of the additional power block APB.

In the meantime, the plurality of additional power lines 186 connects the power block PB and the additional power block APB. The power block PB and the additional power block APB are spaced apart from each other in the third directions Z and Z' so that the plurality of additional power lines 186 which connects the power block PB and the additional power block APB may extend in the third directions Z and Z'.

Further, each of the plurality of additional power lines 186 which extends in the third directions Z and Z' may be disposed on the plurality of fourth sub line patterns 124d extending in the third directions Z and Z'.

Further, the shape of the plurality of additional power lines 186 may be the same as the shape of the plurality of fourth sub line patterns 124d. Specifically, each of the plurality of fourth sub line patterns 124d and the plurality of additional power lines 186 has a wavy shape. For example, each of the plurality of fourth sub line patterns 124d and the plurality of additional power lines 186 has a sinusoidal shape. However, the shape of each of the plurality of fourth sub line patterns 124d and the plurality of additional power lines 186 is not limited thereto. For example, each of the plurality of fourth sub line patterns 124d and the plurality of additional power lines 186 may extend in a zigzag pattern or may be formed with various shapes such as a shape extended by connecting a plurality of rhombus-shaped substrates at vertexes.

As illustrated in FIG. 13, each of the plurality of additional power lines 186 may include a plurality of power line layers disposed on different layers. Specifically, the plurality of additional power lines 186 may include a first additional power line 186-1 and a second additional power line 186-2 disposed on different layers.

The first additional power line 186-1 is disposed on the fourth sub line pattern 124d disposed on the lower substrate 111, the passivation layer 145 and the planarization layer 146 are disposed on the first additional power line 186-1, and the second additional power line 186-2 is disposed on the planarization layer 146.

The first additional power line 186-1 is configured by the same material as the first additional power pattern APP1 and the first power pattern PP1 and the second additional power line 186-2 is configured by the same material as the first additional power pattern APP1 and the second power pattern PP2.

For example, in FIG. 13, the first additional power line 186-1 may be formed of the same material as the source electrode and the drain electrode of the transistor. However, the first additional power line 186-1 is not limited thereto and the first additional power line 186-1 may be formed of the same material as the intermediate metal layer disposed between the first interlayer insulating layer 143 and the second interlayer insulating layer 144. Alternatively, the first additional power line 186-1 may be formed of the same material as the gate electrode of the transistor disposed between the gate insulating layer 142 and the first interlayer insulating layer 143.

However, even though in FIG. 13, it is illustrated that the additional power line 186 is configured by only two additional power line layers 186-1 and 186-2, the present disclosure is not limited thereto. Therefore, the additional power line 186 may be configured by three or more additional power line layers disposed on different layers.

In the display device according to another embodiment of the present disclosure, a component of the power supply PS which is disposed on a relatively upper layer may include not only the 1-2-th power line, the 2-2-th power line 185b-2, and the second power pattern PP2, but also the second additional power pattern APP2 and the second additional power line 186-2. That is, according to another embodiment of the present disclosure, the second additional power pattern APP2 and the second additional power line 186-2 are further included so that an area of the component which stores the high potential voltage may be increased. That is, according to another embodiment of the present disclosure, the power supply reduces or minimizes a resistance of the component which stores the high potential voltage to reduce or minimize the voltage drop of the high potential voltage.

Further, a component of the power supply PS which is disposed on a relatively lower layer may include not only the 1-1-th power line, the 2-1-th power line 185b-1, and the first power pattern PP1, but also the first additional power pattern APP1 and the first additional power line 186-1. That is, according to another embodiment of the present disclosure, the first additional power pattern APP1 and the second additional power line 186-1 are further included so that an area of the component which stores the low potential voltage may be increased. That is, according to another embodiment of the present disclosure, the power supply reduces or minimizes a resistance of the component which stores the low potential voltage to reduce or minimize the voltage drop of the low potential voltage.

That is, in the display device according to another embodiment of the present disclosure, the power supply includes an additional power block to reduce or minimize the driving voltage drop. Therefore, a uniform voltage is applied to all the pixels of the display device according to another embodiment of the present disclosure so that the image quality may be uniformized.

The embodiments of the present disclosure can also be described as follows:

According to an aspect of the present disclosure, a display device includes a lower substrate which includes an active area and a non-active area and is stretchable; a pattern layer which is disposed on the lower substrate and includes a plurality of first plate patterns and a plurality of first line patterns formed in the active area and a plurality of second plate patterns and a plurality of second line patterns formed in the non-active area; a plurality of pixels formed on the plurality of first plate patterns; a plurality of first connection lines which connects the plurality of pixels; a gate driver formed on the plurality of second plate patterns; a power supply formed on the plurality of second plate patterns; a plurality of second connection lines disposed in the non-active area; and an upper substrate which covers the gate driver, the power supply, and the plurality of pixels and is stretchable, the non-active area includes a first area located at the outside of the active area, a second area which is located at the outside of the first area and includes the plurality of gate drivers disposed therein, and a third area which is located at the outside of the second area and includes the plurality of power supplies disposed therein, and the plurality of second connection lines disposed in the first area is in contact with a metal pattern disposed on a layer different from the plurality of second connection lines, by means of an anchor hole.

The plurality of second plate patterns includes a plurality of first sub plate patterns disposed in the first area, a plurality of second sub plate patterns disposed in the second area, and a plurality of third sub plate patterns disposed in the third area, the plurality of second line patterns includes a plurality of first sub line patterns disposed in the first area, a plurality of second sub line patterns disposed in the second area, and a plurality of third sub line patterns disposed in the third area, and the anchor hole is formed on the plurality of first sub plate patterns.

Each of the plurality of pixels may include a transistor including a gate electrode, a source electrode, and a drain electrode and the metal pattern may be formed on the same layer as the source electrode and the drain electrode.

Each of the plurality of pixels may include a transistor including a gate electrode, a source electrode, and a drain electrode and the metal pattern may be formed on the same layer as the gate electrode.

The plurality of second sub plate patterns may be spaced apart from each other only in the second direction and the plurality of third sub plate patterns may be spaced apart from each other in the first direction and the second direction.

A plurality of stages which configures the gate driver may be disposed on the plurality of second sub plate patterns and a plurality of power blocks which configures the power supply may be disposed on the plurality of third sub plate patterns.

The plurality of power blocks may include a first power pattern and a second power pattern disposed on different layers.

Each of the plurality of pixels may include a transistor including a gate electrode, a source electrode, and a drain electrode, the first power pattern may be formed of the same material as the source electrode and the drain electrode, and the second power pattern may be formed of the same material as the second connection line.

The plurality of third sub line patterns may include a 3-1-th sub line pattern which may connect a plurality of third sub plate patterns spaced apart from each other in a first direction and a 3-2-th sub line pattern which may connect a plurality of third sub plate patterns spaced apart from each other in a second direction.

A plurality of second connection lines disposed in the third area may connect the plurality of power blocks and the plurality of second connection lines disposed in the third area may include a first power line disposed on the 3-1-th sub line pattern and a second power line disposed on the 3-2-th sub line pattern.

The first power line may include a 1-1-th power line and a 1-2-th power line disposed on different layers and the second power line may include a 2-1-th power line and a 2-2-th power line disposed on different layers.

The 1-1-th power line and the 2-1-th power line may be configured by the same material as the first power pattern and the 1-2-th power line and the 2-2-th power line may be configured by the same material as the second power pattern.

The display device may further comprise a plurality of additional power blocks disposed between the plurality of power blocks which are spaced apart from each other in a third direction.

The plurality of additional power blocks may include a first additional power pattern and a second additional power pattern disposed on different layers.

The first additional power pattern may be electrically connected to the first power pattern and the second additional power pattern may be electrically connected to the second power pattern.

According to another aspect of the present disclosure, a display device includes: a flexible substrate; a plurality of rigid patterns formed on the flexible substrate; a plurality of pixels which is formed above a plurality of first plate patterns spaced apart from each other, among the plurality of rigid patterns; and a power supply which is formed above some of a plurality of second plate patterns spaced apart from each other, among the plurality of rigid patterns, the power supply supplies a driving voltage of the plurality of pixels and is configured by power blocks which are spaced apart from each other in a first direction and a second direction.

The plurality of power blocks may include a first power pattern and a second power pattern disposed on different layers.

Different driving voltages may be applied to the first power pattern and the second power pattern.

The plurality of power blocks may be connected by a plurality of first power lines stretched in a first direction and a plurality of second power lines stretched in a second direction.

The first power line may include a 1-1-th power line and 1-2-th power line disposed on different layers and the second power line may include a 2-1-th power line and a 2-2-th power line disposed on different layers.

The 1-1-th power line and the 2-1-th power line may be electrically connected to the first power pattern and the 1-2-th power line and the 2-2-th power line may be electrically connected to the second power pattern.

The display device may further comprise a plurality of additional power blocks which are disposed between the plurality of first power lines and between the plurality of second power lines.

The plurality of additional power blocks may include a first additional power pattern and a second additional power pattern disposed on different layers.

The first additional power pattern may be electrically connected to the first power pattern and the second additional power pattern may be electrically connected to the second power pattern.

The display device may further comprise a gate driver between the power supply and the plurality of pixels and the gate driver and the plurality of pixels may be connected by a plurality of buffer lines and the plurality of buffer lines may be fixed to a metal layer formed on a layer different from the plurality of buffer lines, by means of an anchor hole.

The anchor hole may be formed above the others of the plurality of second plate patterns spaced apart from each other, among the plurality of rigid patterns.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
a lower substrate which includes an active area and a non-active area and is stretchable;
a pattern layer which is disposed on the lower substrate and includes a plurality of first plate patterns and a plurality of first line patterns formed in the active area and a plurality of second plate patterns and a plurality of second line patterns formed in the non-active area;
a plurality of pixels formed on the plurality of first plate patterns;
a plurality of first connection lines which are coupled respectively to the plurality of pixels;
a plurality of gate drivers formed on the plurality of second plate patterns;
a plurality of power supplies formed on the plurality of second plate patterns;
a plurality of second connection lines disposed in the non-active area; and
an upper substrate which covers the plurality of gate drivers, the plurality of power supplies, and the plurality of pixels and is stretchable,
wherein the non-active area includes a first area located outside of the active area, a second area which is located outside of the first area and includes the plurality of gate drivers disposed therein, and a third area which is located outside of the second area and includes the plurality of power supplies disposed therein, and
wherein the plurality of second connection lines disposed in the first area is in contact with a metal pattern disposed on a layer different from the plurality of second connection lines, by means of an anchor hole.

2. The display device according to claim 1, wherein the plurality of second plate patterns includes a plurality of first sub plate patterns disposed in the first area, a plurality of second sub plate patterns disposed in the second area, and a plurality of third sub plate patterns disposed in the third area, the plurality of second line patterns includes a plurality of first sub line patterns disposed in the first area, a plurality of second sub line patterns disposed in the second area, and a plurality of third sub line patterns disposed in the third area, and the anchor hole is formed on the plurality of first sub plate patterns.

3. The display device according to claim 2, wherein each of the plurality of pixels includes a transistor including a gate electrode, a source electrode, and a drain electrode and the metal pattern is formed on a same layer as the source electrode and the drain electrode.

4. The display device according to claim 2, wherein each of the plurality of pixels includes a transistor including a gate electrode, a source electrode, and a drain electrode and the metal pattern is formed on a same layer as the gate electrode.

5. The display device according to claim 2, wherein the plurality of second sub plate patterns is spaced apart from each other only in a second direction and the plurality of third sub plate patterns is spaced apart from each other in a first direction and the second direction.

6. The display device according to claim 5, wherein a plurality of stages which configures the gate driver is disposed on the plurality of second sub plate patterns and a plurality of power blocks which configures the power supply is disposed on the plurality of third sub plate patterns.

7. The display device according to claim 6, wherein the plurality of power blocks includes a first power pattern and a second power pattern disposed on different layers.

8. The display device according to claim 7, wherein each of the plurality of pixels includes a transistor including a gate electrode, a source electrode, and a drain electrode, the first power pattern is formed of a same material as the source electrode and the drain electrode, and the second power pattern is formed of a same material as the plurality of second connection lines.

9. The display device according to claim 7, wherein the plurality of third sub line patterns includes:
a 3-1-th sub line pattern which couples a plurality of third sub plate patterns spaced apart from each other in the first direction; and a 3-2-th sub line pattern which couples a plurality of third sub plate patterns spaced apart from each other in the second direction.

10. The display device according to claim 9, wherein a plurality of second connection lines disposed in the third area couples the plurality of power blocks and the plurality of second connection lines disposed in the third area includes a first power line disposed on the 3-1-th sub line pattern and a second power line disposed on the 3-2-th sub line pattern.

11. The display device according to claim 10, wherein:
the first power line includes a 1-1-th power line and a 1-2-th power line disposed on different layers; and
the second power line includes a 2-1-th power line and a 2-2-th power line disposed on different layers.

12. The display device according to claim 11, wherein the 1-1-th power line and the 2-1-th power line are configured by a same material as the first power pattern and the 1-2-th power line and the 2-2-th power line are configured by a same material as the second power pattern.

13. The display device according to claim 6, further comprising:
a plurality of additional power blocks disposed between the plurality of power blocks which is spaced apart from each other in a third direction.

14. The display device according to claim 13, wherein the plurality of additional power blocks includes:
a first additional power pattern and a second additional power pattern disposed on different layers.

15. The display device according to claim 14, wherein the first additional power pattern is electrically connected to the first power pattern and the second additional power pattern is electrically connected to the second power pattern.

16. A display device, comprising:
a flexible substrate;
a plurality of rigid patterns formed on the flexible substrate, the plurality of rigid patterns including a plurality of first plate patterns and a plurality of second plate patterns;
a plurality of pixels which is formed above the plurality of first plate patterns spaced apart from each other, among the plurality of rigid patterns; and
a power supply which is formed above some of the plurality of second plate patterns spaced apart from each other, among the plurality of rigid patterns,
wherein the power supply supplies a driving voltage of the plurality of pixels and is configured by power blocks which are spaced apart from each other in a first direction and a second direction.

17. The display device according to claim 16, wherein the plurality of power blocks includes a first power pattern and a second power pattern disposed on different layers.

18. The display device according to claim 17, wherein different driving voltages are applied to the first power pattern and the second power pattern.

19. The display device according to claim 17, wherein the plurality of power blocks is coupled by a plurality of first power lines in the first direction and a plurality of second power lines in the second direction.

20. The display device according to claim 19, wherein the plurality of first power lines includes a 1-1-th power line and 1-2-th power line disposed on different layers and the plurality of second power lines includes a 2-1-th power line and a 2-2-th power line disposed on different layers.

21. The display device according to claim 20, wherein the 1-1-th power line and the 2-1-th power line are electrically connected to the first power pattern, and wherein the 1-2-th power line and the 2-2-th power line are electrically connected to the second power pattern.

22. The display device according to claim 17, further comprising:
a plurality of additional power blocks which is disposed between the plurality of first power lines and between the plurality of second power lines.

23. The display device according to claim 22, wherein the plurality of additional power blocks includes a first additional power pattern and a second additional power pattern disposed on different layers.

24. The display device according to claim 23, wherein the first additional power pattern is electrically connected to the first power pattern and the second additional power pattern is electrically connected to the second power pattern.

25. The display device according to claim 16, further comprising:
a gate driver between the power supply and the plurality of pixels,
wherein the gate driver and the plurality of pixels are coupled by a plurality of buffer lines and the plurality of buffer lines is fixed to a metal layer formed on a layer different from the plurality of buffer lines, by means of an anchor hole.

26. The display device according to claim 25, wherein the anchor hole is formed above the others of the plurality of second plate patterns spaced apart from each other, among the plurality of rigid patterns.

27. A display device, comprising:
a flexible substrate having thereon an active area and a non-active area adjacent to the active area;
a plurality of first plate structures on the active area of the flexible substrate;
a plurality of second plate structures on the non-active area of the flexible substrate, each of the second plate structure of the plurality being spaced apart from each other;
at least one line pattern coupled to at least one second plate structure of the plurality of second plate structures;
at least one buffer line on the at least one second plate structure of the plurality of second plate structures; and
at least one anchor hole on the at least one second plate structure of the plurality of second plate structures electrically connecting the at least one buffer line and the at least one second plate structure of the plurality of the second plate structures, the at least one anchor hole fixating the at least one buffer line on the at least one second plate structure of the plurality of second plate structures,
wherein at least part of the non-active area includes a second group of second plate structures of the plurality of second plate structures having thereon power supply circuits, each of the second plate structures of the second group being spaced apart from each other and electrically connected through a plurality of power lines, and
wherein the plurality of power lines includes a first power pattern and a second power pattern disposed in the same direction as each other at respective different layers.

28. The display device of claim 27, comprising:
a conductive pattern on the at least one second plate structure, the conductive pattern disposed in a different layer as the at least one buffer line, the conductive pattern electrically connected to the at least one buffer line via the at least one anchor hole.

29. The display device of claim 28, wherein the conductive pattern is made of a same material as either a source electrode or a drain electrode of a driving transistor disposed in the active area of the flexible substrate.

30. The display device of claim 28, wherein the non-active area of the flexible substrate includes a first non-active area and a second non-active area, the first non-active area between the active area and the second non-active area, wherein the first non-active area includes the at least one second plate structure having thereon the at least one anchor hole, wherein the second non-active area includes a first group of second plate structures of the plurality having thereon driving circuits, each of the second plate structures of the first group being spaced apart from each other and electrically connected together through a plurality of first connection lines.

31. The display device of claim 27, wherein the non-active area of the flexible substrate includes a first non-active area, a second non-active area, and a third-non active area, the first non-active area between the active area and the second non-active area, the second non-active area between the first non-active area and the third non-active area, wherein the first non-active area includes the at least one second plate structure having thereon the at least one anchor hole, wherein the third non-active area includes the second group of second plate structures of the plurality of second plate structures having thereon power supply circuits, and wherein, in operation, different voltages are applied to the first power pattern and the second power pattern.

32. The display device of claim 31, comprising:

at least one sub plate structure in the third-non active area, the at least one sub plate structure disposed in an area not occupied by the second group of second plate structures and the plurality of power lines;

additional power blocks on the at least one sub plate structure; and additional power lines coupled to the additional power blocks, the additional power lines including a first additional power pattern and a second additional power pattern, the additional power lines coupled to the second group of second plate structures adjacent to the at least one sub plate structure.

33. The display device of claim 32, wherein the first additional power pattern and the second additional power pattern are disposed in a same direction as each other at respective different layers, and wherein the first additional power pattern is formed of a same material as the first power pattern and the second additional power pattern is formed of a same material as the second power pattern.

* * * * *